(12) United States Patent
Andou et al.

(10) Patent No.: US 6,748,652 B2
(45) Date of Patent: *Jun. 15, 2004

(54) CIRCUIT BOARD AND METHOD OF MANUFACTURING THE SAME

(75) Inventors: Daizou Andou, Katano (JP); Toshio Sugawa, Katano (JP); Tadashi Nakamura, Suita (JP); Hideki Higashitani, Souraku-gun (JP); Masahide Tsukamoto, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/397,661

(22) Filed: Mar. 26, 2003

(65) Prior Publication Data

US 2003/0180512 A1 Sep. 25, 2003

Related U.S. Application Data

(60) Division of application No. 09/728,286, filed on Dec. 1, 2000, now Pat. No. 6,565,954, which is a continuation-in-part of application No. 09/304,714, filed on May 4, 1999, now Pat. No. 6,197,407.

(30) Foreign Application Priority Data

| May 14, 1998 | (JP) | ............................................ 10-131731 |
| Jun. 8, 1998 | (JP) | ............................................ 10-159586 |
| Jun. 16, 1998 | (JP) | ............................................ 10-168143 |

(51) Int. Cl.[7] ................................................ H01R 3/10
(52) U.S. Cl. .............................. 29/852; 29/830; 29/846
(58) Field of Search ............................................ 29/852

(56) References Cited

U.S. PATENT DOCUMENTS

| 3,264,402 A | 8/1966 | Shaheen et al. ............ 174/68.5 |
| 4,372,804 A | 2/1983 | Hanabusa et al. |
| 4,383,363 A | 5/1983 | Hayakawa et al. ........ 174/68.5 |

(List continued on next page.)

FOREIGN PATENT DOCUMENTS

| EP | 0 568 930 | 11/1993 |
| FR | 2 134 436 | 12/1972 |
| JP | 2-283094 | 11/1990 |

(List continued on next page.)

OTHER PUBLICATIONS

1989, N. Fukutomi et al.. " Development of Fine Line Printed Wiring Technology by Plated Wiring Pattern Transfer Method" *The Institute of Electronics, Information and Communication Engineers*, C–II, vol. J72–C–II, No. 4, pp. 243–253.

*Primary Examiner*—Cathy Lam
(74) *Attorney, Agent, or Firm*—Merchant & Gould, P.C.

(57) ABSTRACT

Through holes formed in an electrical insulating substrate having adhesive layers on its both surfaces are filled with a conductor. Then, supporting bases having wiring layers with a predetermined pattern are laminated on both the surfaces of the electrical insulating substrate, which are then heated and pressurized. After that, the supporting bases are removed, thus obtaining a circuit board in which the wiring layers have been embedded in the adhesive layers. The conductor within the through holes are compressed sufficiently, thus forming minute via holes with high reliability.

2 Claims, 11 Drawing Sheets

U.S. PATENT DOCUMENTS

| | | | |
|---|---|---|---|
| 4,648,179 A | 3/1987 | Bhattacharyya et al. | |
| 4,678,963 A | 7/1987 | Fonda | |
| 4,865,888 A | 9/1989 | Akahoshi et al. | |
| 5,046,238 A | 9/1991 | Daigle et al. | |
| 5,326,966 A | 7/1994 | Fukuda et al. | |
| 5,346,750 A | 9/1994 | Hatakeyama et al. | |
| 5,359,259 A | 10/1994 | Reidinger et al. | |
| 5,374,469 A | 12/1994 | Hino et al. | 428/209 |
| 5,407,511 A | 4/1995 | Nakatani et al. | 156/230 |
| 5,440,075 A | 8/1995 | Kawakita et al. | |
| 5,478,972 A | 12/1995 | Mizutani et al. | |
| 5,480,503 A | 1/1996 | Casey et al. | |
| 5,481,795 A | 1/1996 | Hatakeyama et al. | |
| 5,484,647 A | 1/1996 | Nakatani et al. | |
| 5,498,467 A | 3/1996 | Meola | |
| 5,576,519 A | 11/1996 | Swamy | |
| 5,595,943 A | 1/1997 | Itabashi et al. | |
| 5,652,042 A | 7/1997 | Kawakita et al. | |
| 5,707,925 A | 1/1998 | Akada et al. | |
| 5,719,354 A | 2/1998 | Jester et al. | 174/255 |
| 5,744,758 A | 4/1998 | Takenouchi et al. | |
| 5,860,818 A | 1/1999 | Sakaki et al. | |
| 5,914,358 A | 6/1999 | Kawakita et al. | |
| 5,937,725 A | 8/1999 | Kamijo et al. | |
| 5,950,306 A | 9/1999 | Suzuki et al. | |
| 5,956,843 A | 9/1999 | Mizumoto et al. | |
| 6,051,918 A | 4/2000 | Hayashi et al. | |
| 6,137,054 A | 10/2000 | Uezono et al. | |
| 6,143,116 A | 11/2000 | Hayashi et al. | |
| 6,197,407 B1 | 3/2001 | Andou et al. | 428/209 |
| 6,224,965 B1 | 5/2001 | Haas et al. | |
| 6,242,079 B1 | 6/2001 | Mikado et al. | |
| 6,329,610 B1 | 12/2001 | Takubo et al. | |
| 6,353,189 B1 | 3/2002 | Shimada et al. | |
| 6,365,843 B1 | 4/2002 | Shirai et al. | |

FOREIGN PATENT DOCUMENTS

| | | |
|---|---|---|
| JP | 6-21619 | 1/1994 |
| JP | 6-268345 | 9/1994 |
| JP | 6-318783 | 11/1994 |
| JP | 7-147464 | 6/1995 |
| JP | 7-263828 | 10/1995 |
| JP | 8-213757 | 8/1996 |
| JP | 10-84186 | 9/1996 |
| JP | 8-255982 | 10/1996 |
| JP | 8-287840 | 11/1996 |
| JP | 8-298078 | 11/1996 |
| JP | 2601128 | 1/1997 |
| JP | 10-13028 | 1/1998 |
| JP | 2000-77800 | 3/2000 |

CIRCUIT BOARD AND METHOD OF MANUFACTURING THE SAME

This application is a divisional of application Ser. No. 09/728,286, filed Dec. 1, 2000, now U.S. Pat. No. 6,565,954 which is a CIP of Ser. No. 09/304,714 filed May 4, 1999, now U.S. Pat. No. 6,197,407, both are incorporated herein by reference.

FIELD OF THE INVENTION

The present invention relates to a circuit board in which layers are electrically connected using a conductor such as a conductive paste and to a method of manufacturing the same.

BACKGROUND OF THE INVENTION

Recently, the applicant has proposed a multilayer circuit board in which layers are electrically connected using a conductive paste (in Japanese Patent No. 2,601,128). FIG. 8 shows a method of manufacturing the multilayer circuit board. As shown in FIG. 8(a), release films 501 made of polyester or the like are laminated on both surfaces of a porous substrate 502 obtained by impregnating aromatic polyamide fibers with a thermosetting epoxy resin. As shown in FIG. 8(b), through holes 503 are formed at predetermined positions in the porous substrate 502 by a laser processing method. Then, the through holes 503 are filled with a conductive paste 504 as shown in FIG. 8(c). As a filling method, the porous substrate 502 with the through holes 503 is placed on a table of a screen printing machine and the conductive paste 504 is printed directly from the top of one of the release films 501. In this case, the release film 501 at the printed side serves as a print mask and to prevent the surface of the porous substrate 502 from being polluted. Then, the release films 501 are peeled off from both the surfaces of the porous substrate 502. As a next step, metal foils 505 such as copper foils are laminated on both the surfaces of the porous substrate 502. In this state, it is heated and pressurized, thus bonding the porous substrate 502 and the metal foils 505 as shown in FIG. 8(d). In this process, the porous substrate 502 is compressed to be made thin. Simultaneously, the conductive paste 504 within the through holes 503 also is compressed, and a binder constituent contained in the conductive paste 504 is forced out, thus strengthening the adhesion between conductive constituents and between the conductive constituents and the metal foils 505. As a result, the conductive material contained in the conductive paste 504 becomes dense, and thus layers are electrically connected to each other. After that, a thermosetting resin that is a constituent of the porous substrate 502 and the conductive paste 504 are cured. Finally, as shown in FIG. 8(e), the metal foils 505 are selectively etched in a predetermined pattern, thus completing a double-faced circuit board.

However, in the aforementioned configuration and manufacturing method, when the through holes 503 are formed to be minute, the initial connection resistance increases and greatly varies. Further, the connection resistance varies depending on reliability tests such as a temperature cycling test or a pressure cooker test, which has been a problem. The problem is caused by the aspect ratio, which is the ratio of the diameter of the through holes 503 and the thickness of the porous substrate 502, approaches 1 when the through holes 503 are formed to be minute, and therefore the compressibility required for stabilizing the electric connection cannot be obtained.

In the process of peeling off the release films 501, when the through holes are decreased in diameter, the influence of the release film cannot be ignored at the ends of the through holes. In peeling off the release films, the conductive paste 504 is removed by the release films, thus preventing the through holes from being filled with the conductive paste, which has been another problem.

SUMMARY OF THE INVENTION

Bearing the aforementioned problems in mind, the present invention aims to provide a circuit board that enables minute via holes to be obtained with high reliability using a conductive material such as a conductive paste and a method of manufacturing the same.

In order to solve the aforementioned problems, in a circuit board of the present invention, through holes formed in a thickness direction of an electrical insulating substrate are filled with a conductor, and wiring layers formed on both the surfaces of the electrical insulating substrate in a predetermined pattern are electrically connected by the conductor. The circuit board is characterized in that adhesive layers are formed on both the surfaces of the electrical insulating substrate and at least one wiring layer is embedded in one of the adhesive layers. In such a configuration, the conductor within the through holes is compressed sufficiently and thus minute via holes can be formed with high reliability. That is to say, since at least one wiring layer is embedded in one of the adhesive layers, the conductor within the through holes is compressed sufficiently. As a result, a conductive constituent of the conductor becomes dense, thus enabling via-hole connection with a low initial connection resistance and high reliability.

It is preferred to use a conductive paste as the conductor, since a resinous constituent contained in the conductive paste is forced out from the through holes when the conductive paste within the through holes is compressed and the conductive constituent contained in the conductive paste becomes dense, thus obtaining the via-hole connection with a low initial connection resistance and high reliability more easily.

When the through holes in the topmost layer are covered with a wiring layer, the conductor filling the through holes is not exposed at the surface. Consequently, it is effective to provide such through holes to the top layer of a substrate.

When the wiring layers are formed so that a part of the respective through holes is exposed and such wiring layers are used as inner layers, landless via holes in which via holes are compressed by a smaller wiring than the diameter of the via holes can be obtained. Thus, further minute wiring can be formed.

When at least the surface of each wiring layer facing the through holes is processed to be rough, the contact area between the wiring layer and the conductor increases, and the adhesion between the wiring layer and the adhesive layer also is increased. Therefore, the process is effective for further improving the reliability of minute via holes.

A first method of manufacturing a circuit board according to the present invention comprises: providing through holes in an electrical insulating substrate having adhesive layers formed on its both surfaces; filling the through holes with a conductive paste; superposing a supporting base, on which a wiring layer has been formed in a predetermined pattern, at least on one surface of the electrical insulating substrate; embedding the wiring layer in an adhesive layer by compressing the electrical insulating substrate, on which the supporting base has been superposed, by heating and pressurization; and removing the supporting base while leaving the wiring layer. The method enables a circuit board with via holes having high reliability in connection with a minute wiring layer to be provided by such an easy method that the patterned wiring layer is supported by the laminated supporting base that is removed after press.

A second method of manufacturing a circuit board according to the present invention comprises: laminating release films, each of which has an adhesive layer on its one surface, on both surfaces of an electrical insulating substrate so that each surface of the electrical insulating substrate comes into contact with the adhesive layer; providing through holes in the electrical insulating substrate having the release films; filling the through holes with a conductive paste; peeling off the release films while leaving the adhesive layers in the electrical insulating substrate; superposing a supporting base, on which a wiring layer has been formed in a predetermined pattern, at least on one surface of the electrical insulating substrate; embedding the wiring layer in the adhesive layer by compressing the electrical insulating substrate on which the supporting base has been superposed by heating and pressurization; and removing the supporting base while leaving the wiring layer. This method can avoid such a difficulty in manufacture as to form thin semi-cured adhesive layers on both surfaces of an electrical insulating substrate simultaneously. By such an easy method in which a supporting base on which a wiring layer has been formed is laminated and pressed and then is removed, a circuit board with via holes having high reliability in connection with a minute wiring layer can be provided.

In the aforementioned first or second manufacturing method, when the electrical insulating substrate before being heated and pressurized is a composite material of a semi-cured thermosetting resin and a glass woven fabric and the adhesive layers are formed of the thermosetting resin, a conventional glass epoxy composite material can be used. Therefore, an extra step for providing the adhesive layer is not necessary, resulting in easy manufacture of a circuit board.

The electrical insulating substrate before being heated and pressurized may be formed of a film comprising an organic material as a main constituent and the adhesive layers may be formed of a semi-cured organic resin. By selecting a material having high heat resistance and high stiffness as a film material, characteristics suitable for mounting semiconductors can be provided. The material of the adhesive layer can be freely selected considering electric insulation and a property capable of receiving an object to be embedded. Thus, a circuit board with high performance can be obtained. Furthermore, a thin film with a uniform composition can be produced, which is convenient for forming via holes with a minute diameter.

When the thickness of the adhesive layer provided on the surface of the electrical insulating substrate before being heated and pressurized is substantially the same as or thinner than that of the wiring layer to be embedded in the adhesive layer, the wiring layer can be embedded so as almost to reach the electrical insulating substrate, thus minimizing the decrease in compressive force to the conductive paste due to spread of the adhesive layer in the horizontal direction when being compressed.

When the electrical insulating substrate before being heated and pressurized has spaces capable of receiving constituent materials of the adhesive layers, the electrical insulating substrate receives the constituent materials of the adhesive layers that have been melted by being heated and pressurized. Consequently, distortion of the electrical insulating substrate that is caused by embedding the wiring layer can be restrained.

When the electrical insulating substrate before being heated and pressurized has minute pores through which the constituent materials of the adhesive layers provided on both the surfaces of the electrical insulating substrate can pass, the constituent materials of the adhesive layers that have been melted by being heated and pressurized can flow up and down in the electrical insulating substrate. As a result, the distortion of the electrical insulating substrate can be restrained further.

It is preferable that in the process of removing the supporting base while leaving the wiring layer, the supporting base is selectively melted and removed. By melting and removing the supporting base, a mechanical external force is not applied to the wiring layer. Therefore, a circuit board having a minute wiring layer that is not disconnected or deformed can be manufactured with a good yield. In addition, even a circuit board having a large area can be manufactured easily.

In the aforementioned first or second method of manufacturing a circuit board, it is preferable that the wiring layer and the supporting base are formed of respective materials that enable them to be removed selectively. According to this configuration, after embedding the wiring layer in the adhesive layer, the supporting base can be removed easily while leaving only the wiring layer.

In this case, it is preferable that the wiring layer and the supporting base are formed so as to be removed selectively by different etchants. This configuration prevents the wiring layer from being removed simultaneously by over-etching when removing the supporting base by etching after embedding the wiring layer in the adhesive layer. Therefore, the wiring layer having a minute pattern can be left in the adhesive layer with a good yield. Further, a sufficient difference in etching speed, for example, a difference of about several times is enough for removing one of them selectively by etching.

Further, in the first or second method of manufacturing a circuit board, it is preferable that at least one etching-stopper layer is formed on the surface of the supporting base, a wiring layer is provided on the surface of the etching-stopper layer, and the wiring layer and at least the etching-stopper layer are formed of respective materials that enable them to be removed selectively. According to this configuration, selectivity in removing only one selected from the supporting base and the wiring layer by etching can be improved. As a result, after embedding the wiring layer in the adhesive layer, the supporting base can be removed easily while leaving only the wiring layer. More particularly, in removing the supporting base by etching, the wiring layer can be prevented from being removed simultaneously due to over-etching. Therefore, the wiring layer having a minute pattern can be left in the adhesive layer with a good yield.

In this case, it is preferable that at least the wiring layer and the etching-stopper layer are formed so as to be removed selectively by different etchants. According to this configuration, even if the supporting base and the wiring layer are formed of respective materials that are removed by the same etchant, etching with an etchant capable of removing only the etching-stopper layer selectively enables the supporting base to be removed together with the etching-stopper layer, thus leaving only the wiring layer.

In the first or second method of manufacturing a circuit board, it is preferable that the supporting base on which the wiring layer has been formed is obtained by: forming an insulating-material pattern on the surface of the supporting base or the surface of the etching-stopper layer formed on the supporting base; and forming a wiring layer with a desired pattern by allowing a conductive material to adhere by plating to the area where the surface of the supporting base or the surface of the etching-stopper layer is exposed. According to such a configuration, a wiring layer with a desired pattern can be obtained easily.

In this case, the insulating-material pattern can be formed by allowing a photosensitive resin to adhere to the surface of the supporting base or the surface of the etching-stopper layer, then exposing it selectively according to the desired mask pattern, and developing it. Thus, a desired insulating-material pattern can be formed easily in a desired area.

When the "plating" is electroplating, a conductive material easily can adhere selectively only to the exposed area where no insulating-material pattern has been formed. Consequently, a desired minute wiring pattern can be formed easily.

In the first or second method of manufacturing a circuit board, it is preferable that the supporting base on which the wiring layer has been formed is obtained by: laminating a substrate on the back surface of the supporting base using an adhesive that loses its adhesion at a predetermined temperature or higher; and forming a wiring layer on the surface of the supporting base directly or with an etching-stopper layer being sandwiched therebetween. Even if the supporting base is a thin film member, it can be reinforced by laminating the substrate having a sufficient strength for supporting the supporting base. When the wiring layer is formed after that, the process of forming the wiring layer can be carried out easily. In addition, by laminating the substrate using the adhesive that loses its adhesion at a predetermined temperature or higher, the supporting base and the substrate can be separated easily by heating after predetermined processes. As a result, the working efficiency is improved.

A multilayer circuit board according to a first configuration of the present invention is formed by laminating at least two electrical insulating substrates with an adhesive layer being sandwiched therebetween. The electrical insulating substrates have through holes formed in the thickness direction and filled with a conductor. The multilayer circuit board is characterized in that a wiring layer formed in a predetermined pattern is provided in the adhesive layer and the wiring layer is electrically connected to the conductors in both the electrical insulating substrates sandwiching the adhesive layer due to a compressive force applied in the laminated direction. According to such a configuration, a multilayer circuit board with minute via holes having high reliability can be provided.

A first method of manufacturing a multilayer circuit board according to the present invention is characterized by repeating the steps of: superposing a supporting base, on which a wiring layer has been formed in a predetermined pattern, on one surface of an electrical insulating substrate that has through holes filled with a conductive paste and adhesive layers on its both surfaces; embedding the wiring layer in an adhesive layer by applying a compressive force by heating and pressurization; and removing the supporting base while leaving the wiring layer. According to such a configuration, a simple method of manufacturing a multilayer circuit board can be provided.

In the aforementioned first method of manufacturing a multilayer circuit board, it is preferable that the wiring layer and the supporting base are formed of respective materials that enable them to be removed selectively. It also is preferable that at least one etching-stopper layer is formed on the surface of the supporting base, a wiring layer is provided on the surface of the etching-stopper layer, and the wiring layer and at least the etching-stopper layer are formed of respective materials that enable them to be removed selectively. Furthermore, it is preferable that the supporting base on which the wiring layer has been formed is obtained by: forming an insulating-material pattern on the surface of the supporting base or the surface of the etching-stopper layer formed on the surface of the supporting base; and forming a wiring layer with a desired pattern by allowing a conductive material to adhere by plating to the area where the surface of the supporting base or the surface of the etching-stopper layer is exposed. In addition, it is preferable that the supporting base on which the wiring layer has been formed is obtained by: laminating a substrate on the back surface of the supporting base using an adhesive that loses its adhesion at a predetermined temperature or higher; and forming a wiring layer on the surface of the supporting base directly or with an etching-stopper layer being sandwiched therebetween. The aforementioned methods are preferable due to the same reasons as those in the case of the first or second method of manufacturing a circuit board.

A multilayer circuit board according to a second configuration of the present invention is characterized in that the wiring layer formed of the top layer of the multilayer circuit board according to the first configuration of the present invention and a wiring layer of the top layer of a core substrate having a predetermined number of insulating layers and wiring layers are electrically connected with an electrical insulating substrate, which has adhesive layers on its both surfaces and through holes filled with a conductor, being sandwiched therebetween, and at least one selected from the wiring layer of the top layer of the multilayer circuit board and the wiring layer of the top layer of the core substrate is embedded in an adhesive layer. According to such a configuration, a multilayer circuit board in which the wiring layer of the top layer of the core substrate and the wiring layer of the top layer of the first multilayer circuit board formed of a plurality of layers having minute via holes and minute wiring are electrically connected can be provided.

A second method of manufacturing a multilayer circuit board according to the present invention is characterized by comprising: superposing the multilayer circuit board according to the first configuration of the present invention on a core substrate having a predetermined number of insulating layers and wiring layers with an electrical insulating substrate, which has adhesive layers on its both surfaces and through holes filled with a conductive paste, being sandwiched therebetween; and embedding at least one selected from the wiring layer formed on the top layer of the multilayer circuit board and the wiring layer of the top layer of the core substrate in an adhesive layer by heating and pressurizing the core substrate and the multilayer circuit board that have been superposed with the electrical insulating substrate being sandwiched therebetween. According to such a configuration, a simple method of manufacturing a multilayer circuit board can be provided.

In the first or second method of manufacturing a multilayer circuit board, the electrical insulating substrate before being heated and pressurized may be a composite material of a semi-cured thermosetting resin and a glass woven fabric, and the adhesive layer may be formed of the thermosetting resin. Alternatively, the electrical insulating substrate before being heated and pressurized may be formed of a film comprising an organic material as a main constituent, and the adhesive layer may be formed of a semi-cured organic resin.

In the first or second method of manufacturing a multilayer circuit board, it is preferable that the thickness of each adhesive layer provided on the surfaces of the electrical insulating substrate before being heated and pressurized is substantially the same as or thinner than that of the wiring layer to be embedded in the adhesive layer.

In the first or second method of manufacturing a multilayer circuit board, it is preferable that the electrical insulating substrate before being heated and pressurized has spaces capable of receiving constituent materials of the adhesive layers. It is further preferable that the electrical insulating substrate before being heated and pressurized has minute pores through which the constituent materials of the adhesive layers can pass.

Furthermore, a multilayer circuit board according to a third configuration of the present invention is characterized in that the multilayer circuit board according to the first configuration of the present invention and a core substrate having a predetermined number of insulating layers and wiring layers are laminated with a substrate bonding body having through holes filled with a conductor being sandwiched therebetween, the wiring layer formed on the top layer of the multilayer circuit board and the wiring layer of the top layer of the core substrate are electrically connected via the conductor, and the substrate bonding body before being laminated has compressibility. According to such a configuration, a multilayer circuit board in which the wiring layer of the core substrate and the wiring layer of the first multilayer circuit board formed of a plurality of layers having minute wiring and minute via holes are electrically connected can be provided.

In the above, "the substrate bonding body has compressibility" means that, for example, the substrate bonding body is formed of a porous substrate having holes inside and thus has a property of being able to be compressed. In the case of using the porous substrate, a preferable porosity is 2–35% by volume. When the porosity is lower than that, the substrate bonding body is difficult to be compressed, thus causing increase in the electric connection resistance between the conductor and the wiring layer or a bad connection. On the other hand, when the porosity is higher than that, the substrate bonding body is further deformed in the vertical direction to the compression direction when being compressed and the conductive resin enters into the holes. Consequently, the conductive resin cannot be compressed sufficiently, thus increasing the electric connection resistance between the conductor and the wiring layer.

In the aforementioned third multilayer circuit board, it is preferable that the material forming the substrate bonding body is at least one material selected from resin-impregnated fiber sheet materials composed of a composite material of a glass-fiber nonwoven fabric or an organic-fiber nonwoven fabric, and a thermosetting resin. According to such a preferable configuration, electric and mechanical characteristics of the multilayer circuit board are further improved.

A third method of manufacturing a multilayer circuit board according to the present invention is characterized by comprising: superposing the multilayer circuit board according to the first configuration of the present invention on a core substrate with a predetermined number of insulating layers and wiring layers with a substrate bonding body that has through holes filled with a conductive paste and has compressibility being sandwiched therebetween; and electrically connecting the wiring layer formed on the top layer of the multilayer circuit board and the wiring layer of the core substrate via the conductive paste by heating and pressurizing the multilayer circuit board and the core substrate that have been superposed with the substrate bonding body being sandwiched therebetween. Such a configuration enables a simple method of manufacturing a multilayer circuit board to be provided.

In the aforementioned third method of manufacturing a multilayer circuit board, it is preferable that the conductive paste filling the through holes in the substrate bonding body before being heated and pressurized protrudes from the surfaces of the substrate bonding body. According to such a preferable configuration, the both wiring layers can be electrically connected to each other stably via the conductive paste with a low resistance.

A second circuit board of the present invention includes an electrical insulating substrate, adhesive layers, wirings, and a conductor. The adhesive layers are provided on both surfaces of the electrical insulating substrate. The wirings are formed on both sides of the electrical insulating substrate. The conductor electrically connects the wirings on both sides of the electrical insulating substrate with each other. At least part of the wirings is embedded in the adhesive layers, and a volume of one of the adhesive layers provided on one of both surfaces of the electrical insulating substrate on a side of a smaller volume except a wiring volume is smaller than that of the other adhesive layer provided on the other surface.

The above-mentioned volume except a wiring volume can be defined as the product of the area of portions of the adhesive layer where the wiring is not embedded and the average thickness of portions, of the wiring, embedded in the adhesive layer. The circuit board of the present invention is configured so that the volume of the adhesive layer provided on the side of a smaller volume except a wiring volume is smaller than that of the adhesive layer provided on the other side. This can reduce the difference in stresses applied to both sides of the electrical insulating substrate by the adhesive layers in the case where patterns and densities of the wirings on both sides of the electrical insulating substrate are different from each other, when compared to the difference in a configuration in which adhesive layers with the same volume are provided on both sides of an electrical insulating substrate. Thus, the difference in strength of the connections between the conductor and the wirings on both sides of the electrical insulating substrate is reduced and therefore, the deformation of the electrical insulating substrate can be suppressed, thus reducing inner stress of the circuit board. As a result, a circuit board allowing a stable interlayer connection to be obtained can be provided.

In the second circuit board with the configuration described above, preferably the distances between the electrical insulating substrate and surfaces of the wirings in contact with the conductor are substantially the same on both sides of the electrical insulating substrate. According to this configuration, the strengths of the connections between the wirings and the conductor are substantially the same on both sides of the electrical insulating substrate. Thus, a circuit board allowing a stable interlayer connection to be obtained can be provided.

In the second circuit board with the configuration described above, preferably surfaces of the wirings in contact with the conductor are embedded in the adhesive layers. This configuration allows initial connection resistance to be low, the variation in the initial connection resistance to be reduced, and high connection reliability to be obtained.

In the second circuit board with the configuration described above, preferably the conductor is formed of a conductive paste. According to this configuration, filling of the conductive paste can be carried out by printing, and therefore the conductor can be formed easily.

In the second circuit board with the configuration described above, preferably the electrical insulating substrate is formed of a compound of fiber and thermosetting resin. According to this configuration, it is possible to provide a circuit board having an electrical insulating substrate with high stiffness and having a property allowing electronic circuit components to be mounted easily.

In the second circuit board with the configuration described above, preferably the electrical insulating substrate is formed of an organic resin film. According to this configuration, it is possible to provide a thin and flexible circuit board.

In the second circuit board with the configuration described above, preferably the adhesive layers are formed of thermosetting organic resin. According to this configuration, even when being subjected to a high temperature state, the adhesive layers are not softened. Therefore, a circuit board with connection stability that does not vary depending on heat history can be provided.

A multilayer circuit board of the present invention is characterized by including at least one second circuit board according to any one of the configurations described above. According to this configuration, it is possible to provide a multilayer circuit board allowing a stable interlayer connection to be obtained.

A method of manufacturing a circuit board according to the present invention includes: forming adhesive layers on both surfaces of an electrical insulating substrate; forming a conductor going through the electrical insulating substrate and the adhesive layers; attaching supporting bases with wirings formed thereon to the electrical insulating substrate by pressure so that at least part of the wirings is embedded in the adhesive layers; and removing the supporting bases while leaving the wirings. In the process of forming adhesive layers, a volume of one of the adhesive layers formed on one of both surfaces of the electrical insulating substrate on a side of a smaller volume except a wiring volume is smaller than that of the other adhesive layer formed on the other surface.

The above-mentioned volume except a wiring volume can be defined as the product of the area of portions of the adhesive layer where the wiring is not embedded and the average thickness of portions, of the wiring, embedded in the adhesive layer. In the case of a small volume except a wiring volume, when the supporting bases with the wirings formed thereon are attached to the electrical insulating substrate by pressure, an excess adhesive that cannot be received between the wirings hinders the attachment by pressure between the wirings and the conductor. According to the manufacturing method described above, however, the volume of one of the adhesive layers formed on the side of a smaller volume except a wiring volume is set to be smaller than that of the other adhesive layer formed on the other surface. Consequently, the difference in strength of the connections between the conductor and the wirings on both sides of the electrical insulating substrate is reduced and therefore, the deformation of the electrical insulating substrate after the process of attaching the supporting bases by pressure is suppressed, thus reducing the inner stress of the circuit board. As a result, it is possible to provide a circuit board allowing a stable interlayer connection to be obtained.

In the above-mentioned method of manufacturing a circuit board, preferably the process of forming a conductor includes forming a through hole going through the electrical insulating substrate and the adhesive layers and filling the through hole with a conductive paste.

According to this manufacturing method, filling of the conductive paste can be carried out easily by printing that is suitable for mass production. Consequently, a circuit board allowing a stable interlayer connection to be obtained can be provided at a low cost.

DETAILED DESCRIPTION OF THE INVENTION

EXAMPLES

Figure 1:
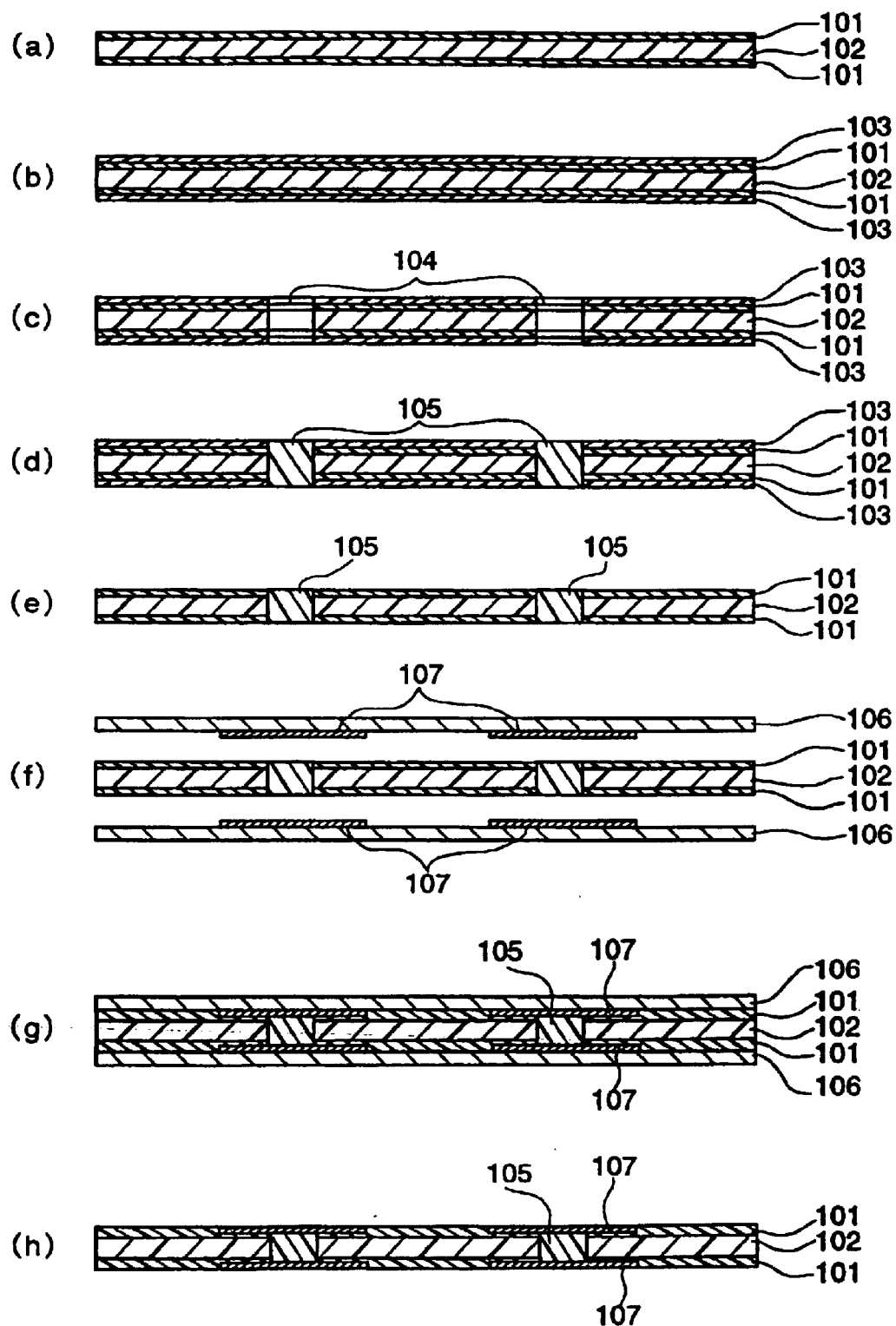
FIGS. 1(a)–(h) show cross-sectional views illustrating steps in a method of manufacturing a double-faced circuit board in a first example of the present invention.

Examples of the present invention will be explained with reference to the drawings as follows.

First Example

FIGS. 1(a)–(e) show cross-sectional views illustrating steps in a method of manufacturing a double-faced circuit board according to a first example of the present invention.

As shown in FIG. 1(a), an electrical insulating substrate 102 with adhesive layers 101 formed on both of its surfaces was prepared.

As the electrical insulating substrate 102, one with excellent dimensional stability and high heat-resistance is used. Films of this kind include a polyimide film, an aramid film, and the like. Polyimide films include "KAPTON" (a trademark of Du Pont-Toray Co., Ltd.), "UPILEX" (a trademark of Ube Industries, Ltd.), and "APICAL" (a trademark of KANEKA CORPORATION). Such polyimide films are characterized by having low water absorption depending on their grade. Aramid films include "ARAMICA" (a trademark of ASAHI CHEMICAL INDUSTRY CO., LTD.) and "MICTRON" (a trademark of TORAY INDUSTRIES, INC.). Such aramide films are characterized by having higher stiffness and being difficult to be elongated compared to the polyimide films.

As the adhesive layers 101, an epoxy adhesive or an imide adhesive was used as an example of a thermosetting resin and a silicon adhesive of a high grade in heat-resistance as an example of a thermoplastic adhesive. It is preferred to prepare a thermosetting resin in a semi-cured state for ensuring that a wiring layer can be embedded therein.

In the present example, an "ARAMICA" film with a thickness of 12 $\mu$m was used as the electrical insulating substrate 102 and an epoxy resin modified with rubber as the adhesive layers 101. The epoxy resin was modified with rubber so as to have good conformability with the film substrate. The epoxy resin was applied onto the substrate 102 and was then dried so as to be in a semi-cured state for ensuring that a pattern can be embedded therein. Each adhesive layer had a thickness of 5 $\mu$m.

As shown in FIG. 1(b), release films 103 such as polyester films were laminated on both the adhesive layers 101 formed on the substrate 102 at about 80° C. Consequently, the surfaces of the adhesive layers 101 were melted slightly, thus permitting the release films 103 to adhere onto the adhesive layers 101. In the present example, polyethylene terephthalate (PET) films having a thickness of 16 $\mu$m were used as the release films 103. The total thickness including the release films 103 was 54 $\mu$m in this stage.

Then, as shown in FIG. 1(c), through holes 104 were formed in the substrate 102 provided with the release films 103 by a laser. As the laser, a short wavelength laser such as an excimer laser with a wave length of 307 nm or a YAG THG (Third Harmonic Generation) laser with a wave length of 355 nm was used. The through holes 104 with a diameter of about 50 $\mu$m were formed by the short wavelength laser.

As shown in FIG. 1(d), the through holes 104 were filled with a conductive paste 105 by printing the conductive paste 105 directly from the top of a release film 103 using a screen printing machine. In this case, vacuum adsorption from the side opposite to the printed surface via a porous sheet such as Japanese paper permitted a resinous constituent contained in the conductive paste 105 within the through holes 104 to be absorbed, thus increasing the proportion of a conductive constituent. As a result, the through holes 104 were filled with the conductive paste containing the denser conductive constituent. In addition, the release film 103 served as a print mask and a pollution controller for the surface of the adhesive layer 101. In this case, the hole diameter and the total thickness were 50 $\mu$m and 54 $\mu$m respectively, and therefore the aspect ratio was one or less. However, the through holes 104 could be filled with the conductive paste by the above mentioned method unless the aspect ratio is less than about 0.3, i.e. the hole diameter is smaller than about 20 $\mu$m.

As shown in FIG. 1(e), the release films 103 were peeled off from the both surfaces. In this case, due to the minute through holes 104 with a diameter of 50 $\mu$m the influence at the ends could not be ignored. Consequently, the conductive paste within the through holes 104 in the release films 103 was removed together with the release films 103. The conductive paste 105 remained within the through holes 104 in various states. However, the remaining conductive paste 105 had no scoop below the surfaces of the adhesive layers 101. Even in the worst case, the adhesive layers 101 were merely worn out (i.e. the upper and lower surfaces of the conductive paste 105 were substantially at the same level as the respective surfaces of the adhesive layers 101). Such removal of the conductive paste by the release films 103 was found significantly when the hole diameter was decreased to 100 $\mu$m or less.

As shown in FIG. 1(f), aluminum-foil supporting bases 106 with wiring layers 107 obtained by forming copper foils in a predetermined shape were superposed from both sides of the substrate 102 with at least the wiring layers 107 being positioned right above the through holes 104 filled with the conductive paste 105, which was then heated and pressurized by vacuum press.

The heating and pressurization allowed the adhesive layers 101 to flow and thus the wiring layers 107 were embedded in the adhesive layers 101 as shown in FIG. 1(g). By embedding the wiring layers 107 in the adhesive layers 101 in such a manner, the conductive paste 105 within the through holes 104 was compressed, and the resinous constituent contained in the conductive paste 105 flowed out in the adhesive layers 101. The conductive constituent contained in the conductive paste 105 became dense, thus electrically connecting the wiring layers 107 positioned on both sides of the substrate 102 to each other. After that, the adhesive layers 101 and the conductive paste 105 were cured.

As the last step, the supporting bases 106 were removed while leaving the wiring layers 107 embedded in the adhesive layers 101 as shown in FIG. 1(h), thus completing a double-faced circuit board. In the present example, aluminum foils were used for the supporting bases 106, and copper foils were used for the wiring layers 107. The supporting bases 106 were removed by melting the aluminum foils by selective etching of the aluminum foils and the copper foils. Since the supporting bases 106 were removed by melting the aluminum foils, the double-faced circuit board was not stressed and thus was not broken. In addition, the supporting bases 106 were removed in a single line, thus improving the productivity. As an etchant for the selective etching, ammonium persulfate or the like can be used. The same method was applied to form the wiring layers 107 in a predetermined pattern. Composite materials of aluminum foil and copper foil include, for example, a copper foil with an aluminum carrier, UTC-Foil, manufactured by Mitsui Mining & Smelting Co., Ltd. The composite material enables fine pattern formation, since the copper foil is thin with a thickness of 5 $\mu$m or 9 $\mu$m.

The same composite material was obtained by preforming a resist pattern on an aluminum foil, treating it with acidic zincate, and then conducting copper electroplating. In the electroplating method, one having a thick copper foil and a fine pattern was obtained. In this method, one having a space of 10 $\mu$m, a linewidth of 10 $\mu$m, and a copper foil with a thickness of 15 $\mu$m was produced experimentally.

The copper foil used in the present example had a thickness of 9 $\mu$m. Each adhesive layer 101 had a thickness of 5 μm, which was set to be thinner than the copper foil. An "ARAMICA" film with a thickness of 12 μm was used as the substrate 102, and epoxy adhesive layers with a thickness of 5 μm were used as the adhesive layers 101. Therefore, the conductive paste 105 had a thickness of 22 μm before the wiring layers 107 were embedded. Copper foils with a thickness of 9 μm were embedded in the conductive layers 101 as the wiring layers 107, thus obtaining a compressibility of 18/22=about 82%. Actually, the conductive paste with a maximum thickness of that of the release films 103 protrudes from the surfaces of the adhesive layers 101. Consequently, the compressibility corresponding to the thickness was added and was therefore further increased. The volume ratio of the resinous constituent and the conductive constituent in the conductive paste 105 was set to about 50% considering print quality. Therefore, most of the resinous constituent in the conductive paste 105 within the through holes 104 was pressed out in the adhesive layers, and the conductive constituent became dense within the through holes 104, thus obtaining via holes with low resistance and high reliability. From experiments, when the volume compressibility was at least 20%, electric connection with low resistance could be obtained, thus improving the connection reliability. Further, the thickness of the adhesive layers 101 was set to be substantially the same as or thinner than that of the wiring layers 107. Therefore, in forcing the wiring layers 107 into the adhesive layers 101, the through holes 104 in the adhesive layers 101 were not increased in diameter, which prevents the compressive force from being lost in the horizontal direction. As a result, the conductive paste 105 was compressed. At that time, the substrate 102 was hardly changed in size. Consequently, most of the pressure by press acted on the inside of the through holes in the vertical direction, thus compressing the conductive paste 105.

One surface, which was to be brought into contact with the conductive paste 105, of each copper foil used as the wiring layers 107 was treated to be rough. Therefore, the adhesion between the adhesive layers 101 and the copper foils increased, thus improving the peel strength. Furthermore, the contact area between the copper foils and the conductive paste 105 also increased, thus improving the connection reliability.

In the above-mentioned example, the adhesive layers 101 were provided on both the surfaces of the substrate 102. However, a release film 103 provided with an adhesive layer 101 may be laminated on each surface of the substrate 102. In such a manufacturing method, the adhesive layer 101 is applied onto one surface of the release film 103 and then can be dried in a semi-cured state. Therefore, the adhesive layers 101 were formed on both the surfaces of the substrate 102 in an easier manner than that by the steps of applying the adhesive layers 101 on both the surfaces of the substrate 102 simultaneously and drying them in a semi-cured state.

Furthermore, FIG. 1 illustrates the aforementioned configuration in which the wiring layers 107 cover the through holes 104. However, the wiring layers 107 are not required to cover the through holes 104 completely. The wiring layers 107 may cover a part of the respective through holes, since the wiring layers 107 only are required to be embedded so that a predetermined compressibility is obtained between the wiring layers within the through holes. In other words, a part of the respective through holes may be exposed as long as the wiring layers are positioned on and beneath the conductive paste so as to compress the conductive paste within the through holes. In the present example, for instance, when using through holes with a diameter of 50 μm and a wiring with a width of 30 μm, the conductive pastes were compressed, thus electrically connecting the wiring layers to each other. Such a configuration does not require a so-called land, resulting in the formation of further minute wiring. The above-mentioned configuration is effective particularly when being applied to inner layers of a multilayer circuit board.

In the aforementioned example, a highly heat-resistant film was used as the substrate 102 and a thermosetting resin or a thermoplastic resin was used as the adhesive layers 101. However, the same configuration can be also obtained by replacing them with a glass epoxy pre-preg. That is to say, a composite material of a glass woven fabric and a semi-cured thermosetting resin can be used as the electrical insulating substrate, and thermosetting resin layers made of the same thermosetting resin as the resin with which the electrical insulating substrate is impregnated can be used as the adhesive layers. The glass epoxy pre-preg does not require the extra formation of the adhesive layers. When the glass woven fabric is impregnated with the thermosetting resin, thermosetting-resin layers are formed on the upper and lower surfaces of the glass woven fabric spontaneously. Therefore, the present invention can be carried out more easily.

An example of a method of manufacturing the supporting bases 106 provided with the wiring layers 107 that were used in the above-mentioned example will be explained with reference to FIGS. 2(a)–(d) as follows.

As shown in FIG. 2(a), a copper foil with an aluminum carrier, UTC-Foil, manufactured by Mitsui Mining & Smelting Co., Ltd. in which a metal layer 110 made of copper used for forming a wiring layer was laminated on a surface of a supporting base 106 made of aluminum was prepared. Such a composite material also can be formed by electroplating, depositing, or bonding copper to an aluminum foil. In this case, considering the removal (etching removal) of the supporting base 106 by being melted in a later process, it is preferable that the supporting base 106 is thin with a thickness of about 1 mm or less. However, to the contrary, an excessively thin supporting base 106 causes handling difficulty. Therefore, it is preferable that the supporting base 106 has a thickness of at least 5 μm. The supporting base 106 used in the present example had a thickness of about 50 μm. It is important that the supporting base 106 is thin so as to be removed by etching easily. However, even if the supporting base 106 has a thickness of about 50 μm, it often is wrinkled or folded depending on a handling manner.

In the present example, for the purpose of easy handling, the supporting base 106 was reinforced by bonding a substrate 113 to the surface of the supporting base 106, on which the metal layer 110 had not been formed, using an adhesive 114 as shown in FIG. 2(b). The substrate 113 was formed of a polyethylene terephthalate (PET) film having a proper strength and relatively high acid resistance and alkali resistance. As the adhesive 114, one whose adhesion was substantially decreased or lost at a predetermined temperature or higher was used. The adhesive 114 in the present invention contains a foaming agent that foams at a predetermined temperature or higher. As the substrate 113 onto which the adhesive 114 adheres, for example, "Thermal Release Sheet 'REVALPHA'" (a trademark of NITTO DENKO CORPORATION) is available on the market.

As a next step, the metal layer 110 was photo-etched to form a wiring layer 107 made of copper having a predetermined pattern (FIG. 2(c)). In this case, a liquid resist was used as a photo resist for the photo-etching. A film resist also can be used, but the liquid resist enables a more minute pattern to be formed. Further, the etchant used for the aluminum forming the supporting base 106 and that used for the copper of the metal layer 110 for forming the wiring layer 107 are different. Therefore, the selection of appropriate etchants for respective metal materials enabled each metal to be etched selectively. In this case, since a normally used copper-chloride or copper-sulfate etchant etches not only copper but also aluminum, a sodium persulfate or ammonium persulfate etchant that does not etch aluminum was selected as the etchant used for the pattern formation using copper, thus selectively etching only the copper. Consequently, even if the copper was over-etched in etching for the pattern formation, the aluminum of the supporting base 106 was not etched.

On the other hand, aluminum can be etched easily by a hydrochloric acid solution (for example, with a ratio of hydrochloric acid:water=1:1), but the copper of the wiring layer 107 is not etched by this solution.

After the pattern formation, the copper surface may be treated, for example, so as to be made rough.

Generally, in removing the resist after etching unwanted areas of the metal layer 110 made of copper, a sodium carbonate alkaline solution is used for the removal of the film resist and a sodium hydroxide alkaline solution or the like is used for the removal of the liquid resist. These solutions etch the aluminum of the supporting base 106 slightly. However, since the substrate 113 having acid resistance and alkali resistance is bonded to the supporting base 106 using the adhesive 114, the supporting base 106 is not etched.

After that, it was heated at least to the temperature at which the foaming agent contained in the adhesive 114 foamed. Consequently, the foaming agent foamed and thus the adhesive 114 lost its adhesion. As a result, the substrate 113 was easily peeled off, thus obtaining the supporting base 106 made of aluminum on which the wiring layer 107 made of copper had been formed in a desired pattern (FIG. 2(*d*)).

In the above, the heating temperature can be selected from a range of 90° C.–180° C. depending on the foaming agent. However, a proper temperature is about 150° C., since the foaming agent can fully withstand 150° C. in a baking step of the photo-resist and the temperature of about 150° C. prevents the aluminum of the supporting base 106 and the copper of the wiring layers 107 from being deteriorated due to thermal oxidation caused by the foaming temperature.

In the above example, a PET film was used as the substrate 113. However, other organic materials, glass, or stainless steel may be used as long as it has a proper strength and relatively high acid resistance and alkali resistance.

Second Example

A method of manufacturing a double-faced circuit board according to a second example of the present invention will be explained with reference to FIGS. 3(*a*)–(*d*).

Figure 3:
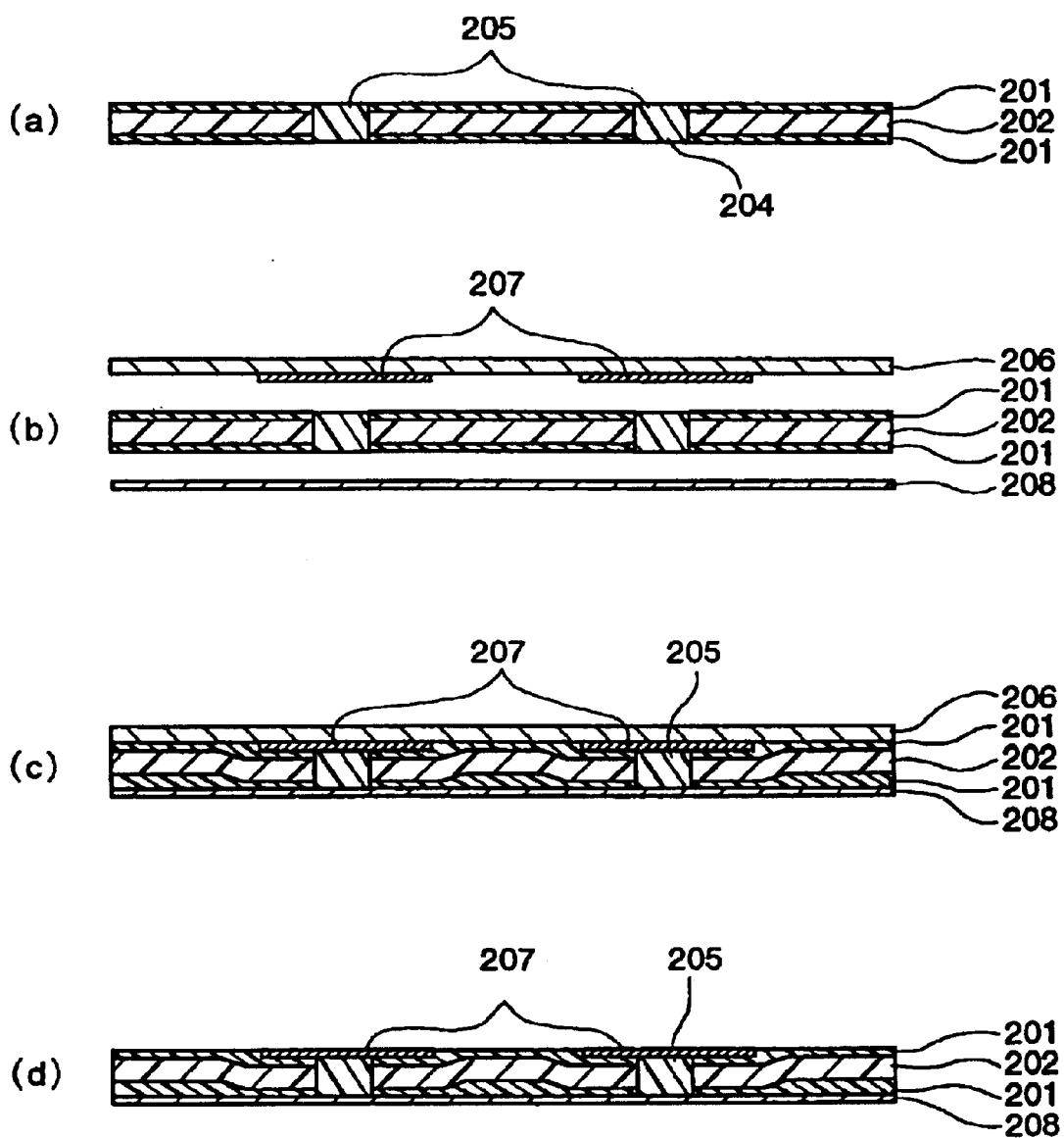
FIGS. 3(a)–(d) show cross-sectional views illustrating steps in a method of manufacturing a double-faced circuit board in a second example of the present invention.

As shown in FIG. 3(*a*), through holes 204 were formed in an electrical insulating substrate 202 having adhesive layers 201 formed on its both surfaces and were filled with a conductive paste 205 as in the first example. Then, as shown in FIG. 3(*b*), a supporting base 206 provided with a wiring layer 207 formed in a predetermined form was superposed from one side of the substrate 202 so that at least the wiring layer 207 was positioned right above the through holes 204 filled with the conductive paste 205, and a copper foil 208 was superposed from the other side, which was then heated and pressurized by vacuum press. The heating and pressurization allowed the adhesive layers 201 to flow and thus the wiring layer 207 was embedded in the adhesive layer 201 on which the supporting base 206 had been superposed as shown in FIG. 3(*c*). By embedding the wiring layer 207 in the adhesive layer 201 in such a manner, the substrate 202 was deformed. The conductive paste 205 within the through holes 204 was compressed, and a resinous constituent contained in the conductive paste 205 flowed out in the adhesive layers 201. Therefore, the conductive constituent contained in the conductive paste 205 became dense, thus electrically connecting the wiring layer 207 positioned on one side and the copper foil 208 on the other side of the substrate 202. After that, the adhesive layers 201 and the conductive paste 205 were cured. As the last step, the supporting base 206 was removed while leaving the wiring layer 207 embedded in the adhesive layer 201 as shown in FIG. 3(*d*), thus completing a double-faced circuit board. The present example differs from the first example in that the conductive paste 205 is compressed from one side of the substrate 202.

In the present example, the thickness of a film as the electrical insulating substrate 202 is set to be 12 $\mu$m and the thickness of each adhesive layer 201 is set to be 5 $\mu$m as in the first example. Similarly, the thickness of the wiring layer 207 is set to be 9 $\mu$m as in the first example. That is to say, the total thickness of the adhesive layers and the thickness of the wiring layer 207 are set to be substantially the same. This allows the substrate 202 to be deformed sufficiently in forcing the wiring layer 207 into the adhesive layer 201. Therefore, the through holes in the adhesive layers 201 are not increased in diameter, thus compressing the conductive paste 205. In this example, a compressibility of 9/22=about 41% is obtained. Actually, the conductive paste with a maximum thickness of that of release films protruded from the surfaces of the adhesive layers 201. Consequently, the compressibility corresponding to the thickness was added, and was therefore further increased. The volume ratio of the resinous constituent and the conductive constituent in the conductive paste 205 was set to be about 50% considering print quality. Therefore, most of the resinous constituent in the conductive paste 205 within the through holes 204 was pressed out in the adhesive layers, and the conductive constituent became dense within the through holes 204, thus obtaining via holes with low resistance and high reliability. From experiments, when the volume compressibility was at least 20%, electric connection with low resistance could be obtained, thus improving the connection reliability.

In the present example, the total thickness of the adhesive layers 201 was substantially the same as the thickness of the wiring layer 207. However, when the wiring layer is thicker than the adhesive layer, further excellent electric connection can be obtained. In this case, adhesives are received between conductors in the wiring layer. Therefore, when the wiring layer is too thick, the portions between the conductors cannot be filled. In addition, the increase in volume of deformation of the electrical insulating substrate is anticipated. The volume of deformation varies depending on the density of the wiring layer, i.e. a ratio of residual copper.

Therefore, in the case of using a porous material, in which spaces capable of receiving constituent materials of adhesive layers provided on both surfaces of an electrical insulating substrate are formed, as the electrical insulating substrate, when the adhesive layers flow due to heating and pressurization, the constituent materials of the melted adhesive layers can be received. Therefore, the volume of deformation of the electrical insulating substrate can be restrained. Thus, the stability in connection can be increased. Further, constituent materials of the adhesive layer beneath the wiring layer are received between patterns of the wiring layer. Therefore, it is conceivable that the amount of the constituent materials to be received between the patterns varies depending on the pattern arrangement. However, since the electrical insulating substrate is provided with spaces capable of receiving the constituent materials of the adhesive layers provided on both the surfaces of the electrical insulating substrate, the variation in amount of the constituent materials to be received can be restrained to the minimum.

Furthermore, in the case of using a porous material having minute pores, through which the constituent materials of the adhesive layers provided on both the surfaces of the electrical insulating substrate can pass, as the electrical insulating substrate, when the adhesive layers flow due to heating and pressurization, the constituent materials of the melted adhesive layers can move up and down in the electrical insulating substrate. Therefore, such an electrical insulating substrate is more effective. Any minute pores are acceptable as long as the pores are minute to such an extent that the conductive constituents in the conductive paste do not flow out. For example, when the conductive constituent is copper powder with a diameter of 10 µm, minute pores with a diameter of about 5 µm are acceptable.

Third Example

A method of manufacturing a multilayer circuit board according to a third example of the present invention will be explained with reference to FIGS. 4(a)–(e).

Figure 4:
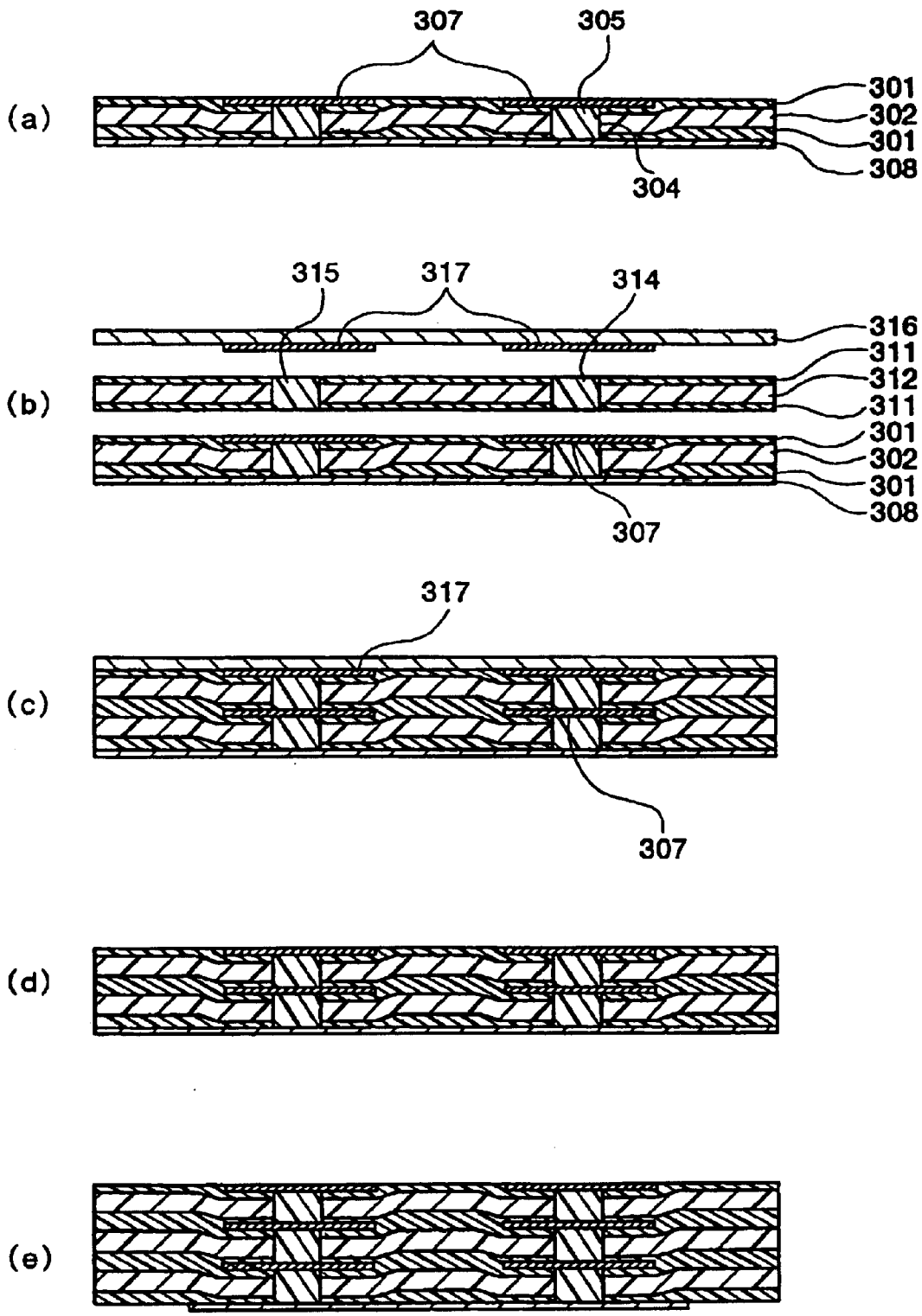
FIGS. 4(a)–(e) show cross-sectional views illustrating steps in a method of manufacturing a multilayer circuit board in a third example of the present invention.

As shown in FIG. 4(a), a double-faced circuit board was manufactured as in the second example. Numerals 301 and 302 indicate adhesive layers and an electrical insulating substrate. A numeral 304 denotes through holes provided in the substrate 302. The through holes 304 are filled with a conductive pate 305. The conductive paste 305 within the through holes 304 is compressed from one side by a wiring layer 307. A numeral 308 indicates a copper foil. On the surface at the side of the wiring layer 307 of the double-faced circuit board formed as mentioned above, an electrical insulating substrate 312 provided with adhesive layers 311 on its both surfaces and through holes 314 filled with a conductive paste 315 at predetermined positions was superposed together with a supporting base 316 with a wiring layer 317 formed in a predetermined pattern as shown in FIG. 4(b). Then, as shown in FIG. 4(c), it was heated and pressurized by vacuum press, thus electrically connecting the wiring layer 307 and the wiring layer 317. After that, as shown in FIG. 4(d), the supporting base 316 was removed. The steps shown in FIGS. 4(b)–4(d) were repeated for a predetermined number of times to laminate a predetermined number of layers. Then, as shown in FIG. 4(e), the copper foil 308 was etched in a predetermined shape, thus completing a multilayer circuit board.

In the multilayer circuit board of the present example, via holes (for example, through holes 314) can be formed on via holes (for example, through holes 304), thus increasing the wiring density. Furthermore, since the surface from which the supporting base 316 has been removed is flat, even lamination of many layers does not cause unevenness on the surface, thus enabling a large number of layers to be laminated.

The multilayer circuit board of the present invention has a smooth surface and is therefore convenient for mounting semiconductor bare chips. The flatness of the actually manufactured multilayer circuit board was ±5 µm in a square with sides of 10 mm in the area where the semiconductor bare chips were to be mounted, which was extremely flat. When semiconductor bare chips were mounted face down, the mounting yield was good due to the excellent flatness of the surface under the chips, thus improving mounting reliability.

In the method of manufacturing a multilayer circuit board of the present invention, the layers are laminated on the copper foil 308. Therefore, a change in size after the lamination can be restrained. Thus, dislocation can be suppressed even in the case where a large number of layers are laminated, which enables the design with a precise design rule.

The method of manufacturing the supporting base 106 (or 206, 316) with the wiring layer 107 (or 207, 317) in the aforementioned first to third examples was explained with reference to FIG. 2, but the following methods also can be employed.

Production Method 1

Figure 5:
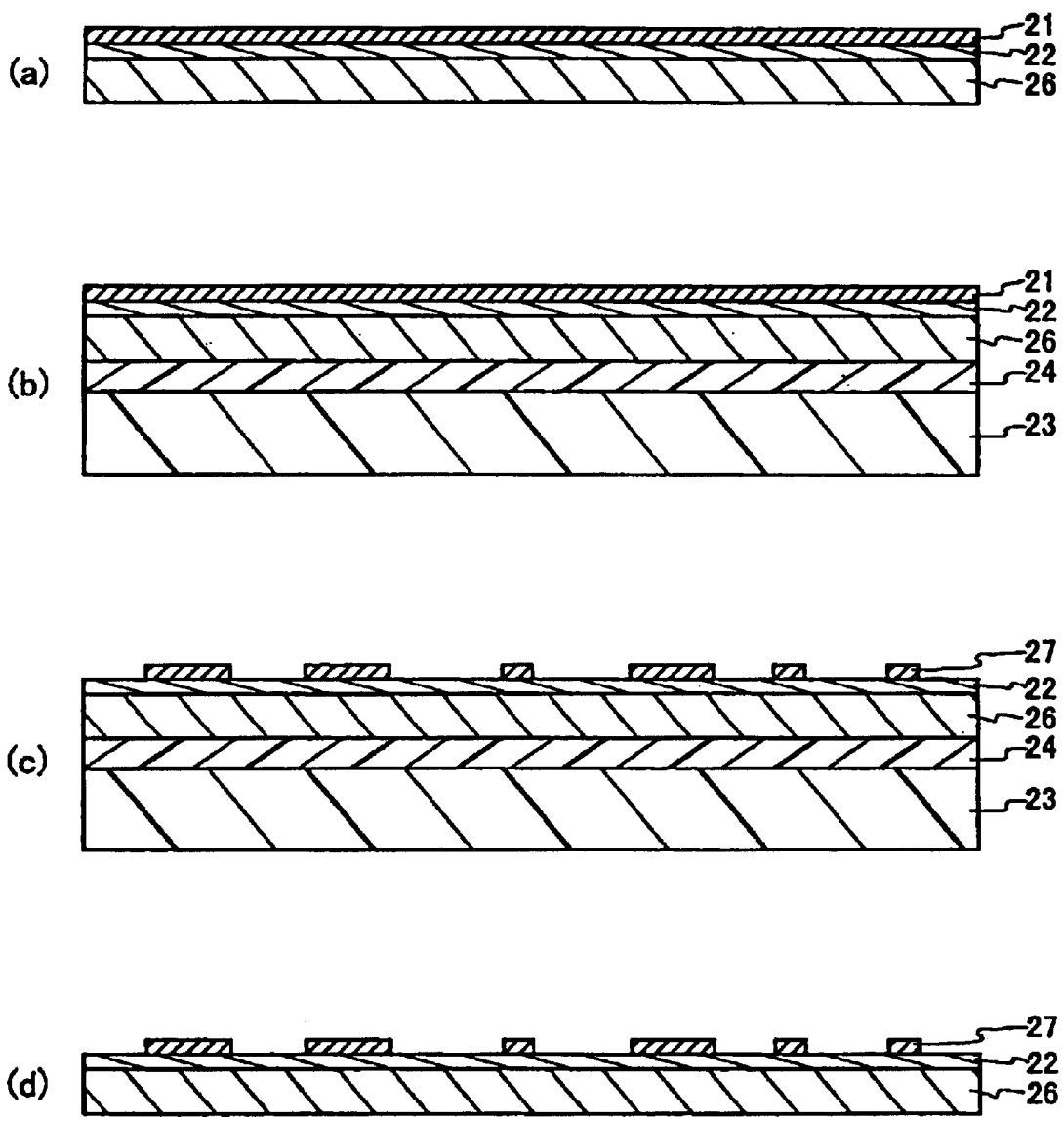
FIGS. 5(a)–(d) show cross-sectional views illustrating steps in another example of the method of manufacturing a supporting base on which a wiring layer of the present invention has been formed.

As shown in FIG. 5(a), using a copper foil with a thickness of about 18 µm, which can be removed by etching easily in a later step, as a supporting base 26, a nickel layer with a thickness of about 3 µm having no pin hole or the like was formed as an etching-stopper layer 22 on the copper foil 26 by plating, deposition, bonding, or the like. Further, a metal layer 21 made of copper as a wiring layer material was formed on the nickel layer 22 by plating, deposition, bonding, or the like. In this case, the metal layer 21 is required to have a thickness that satisfies electric characteristics as a wiring layer, is not affected by side etching or the like in a later etching step, and thus enables a minute pattern to be formed. Considering this, the metal layer 21 was formed to be about 10 µm in the present production method.

Figure 2:
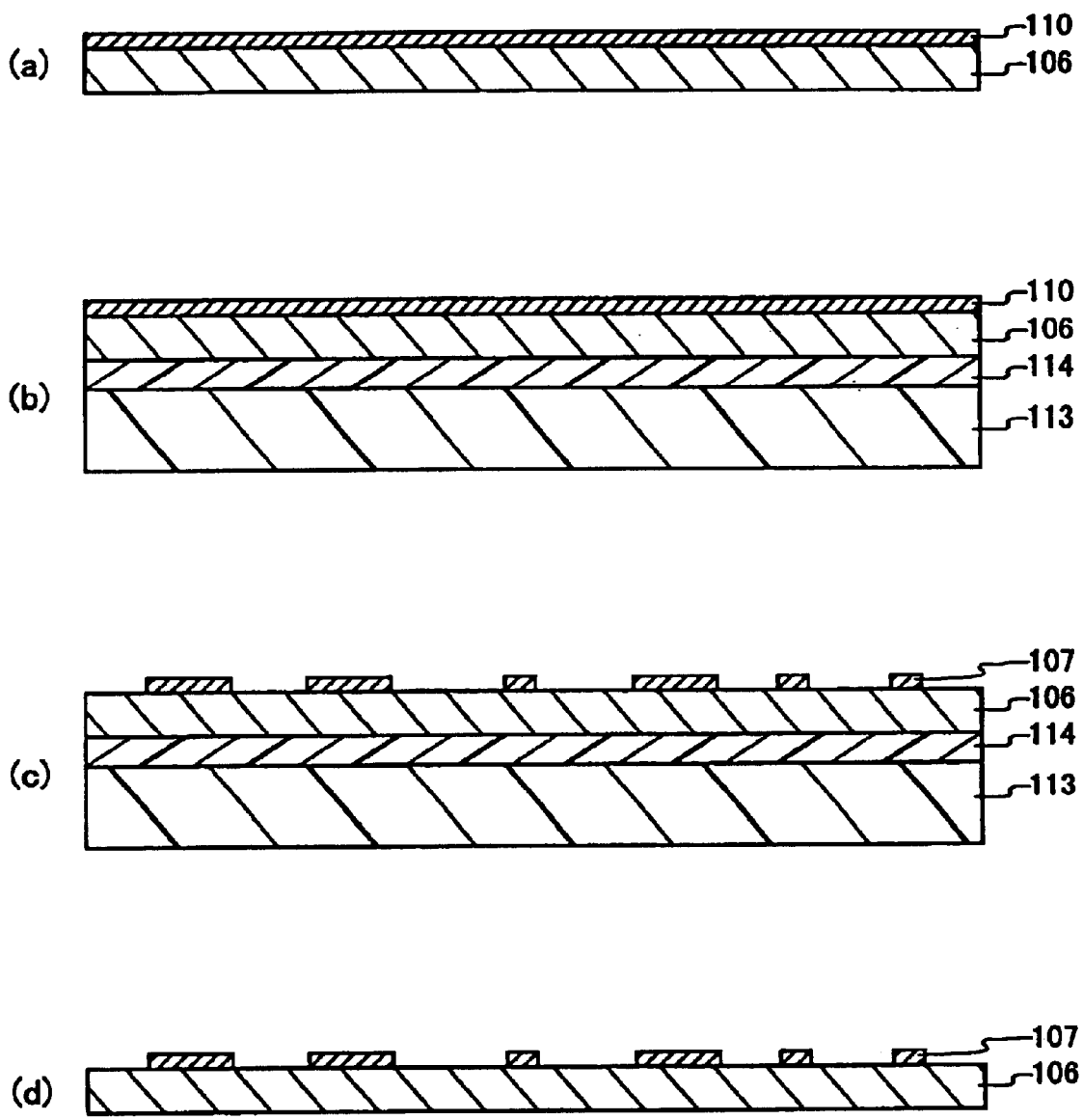
FIGS. 2(a)–(d) show cross-sectional views illustrating steps in an example of a method of manufacturing a supporting base on which a wiring layer of the present invention has been formed.

As a next step, as in the case shown in FIG. 2, a substrate 23 formed of a PET film was bonded to the surface of the supporting base 26 opposite the surface on which the nickel layer 22 and the copper layer 21 had been laminated, using an adhesive 24 containing a foaming agent (FIG. 5(b)).

Then, the copper of the metal layer 21 of the top surface was photo-etched to form a wiring layer 27 with a desired pattern (FIG. 5(c)). As an etchant, an ammonium persulfate solution was used. In this case, since the nickel of the etching-stopper layer 22 was not etched by the ammonium persulfate solution, only the copper of the metal layer 21 was etched. The copper of the supporting base 26 was protected by the substrate 23 from the back side and therefore was not attacked at all.

After that, the temperature was increased to a predetermined temperature by heating. This caused the foaming agent to foam and thus the adhesive 24 lost its adhesion. As a result, the substrate 23 and the supporting base 26 were easily separated at the bonded interface. Thus, a layered product in which the supporting base 26, the etching-stopper layer 22, and the wiring layer 27 made of copper with a desired pattern were laminated sequentially was obtained (FIG. 5(d)).

The layered product obtained in the present production method was used instead of each supporting base 106 with the wiring layer 107 in the first example and was heated and pressurized as in the first example. The wiring layers 27 were embedded in the adhesive layers 101, and the wiring layers 27 on both the surfaces of the electrical insulating substrate 102 were electrically connected to each other.

The copper of the supporting substrates 26 was etched using an ammonium persulfate solution and then the nickel layer 22 was etched using a hydrochloric acid solution to be removed separately, thus obtaining a double-faced circuit board in which the wiring layers 27 had been embedded in the adhesive layers 101.

In the above example, copper was used for the supporting substrate 26. However, any material can be used as long as the etchant used for the material is different from that used for the etching-stopper layer 22. Therefore, aluminum may be used. Further, as the etching-stopper layer 22, iron, chromium, or the like can be used instead of nickel. Depending on the selection of the etchants, the respective materials can be combined variously.

The steps of embedding the wiring layers 27 in the adhesive layers 101 and separating the substrates 23 can be carried out simultaneously by: laminating the layered bodies in the state shown in FIG. 5(c) on the electrical insulating substrate 102 without peeling and removing the substrates 23 by heating (see FIG. 1(f)); and when heating and pressurizing it, increasing temperature to at least a temperature that enables the foaming agent contained in the adhesive 24 to foam.

Production Method 2

Figure 6:
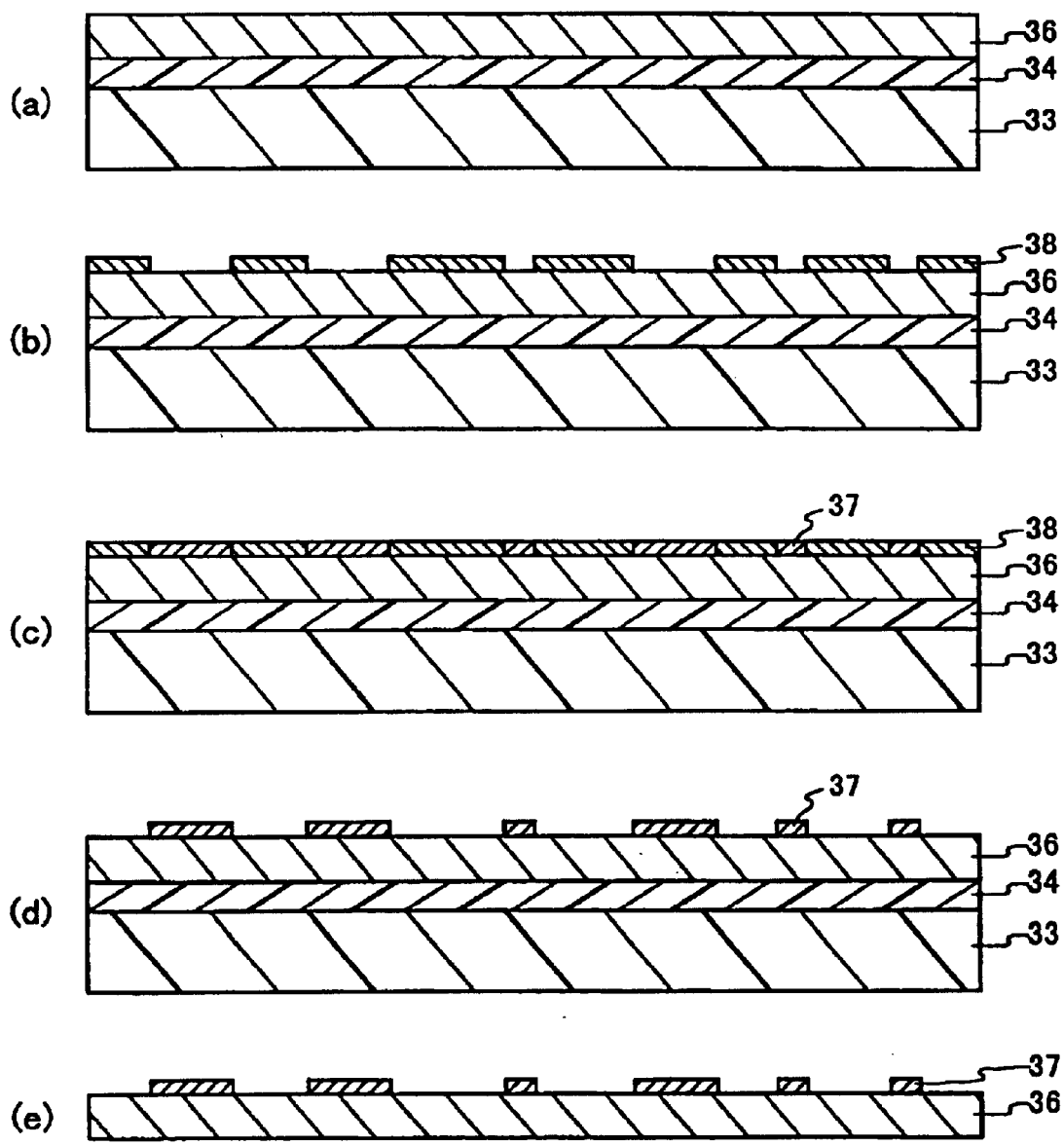
FIGS. 6(a)–(e) show cross-sectional views illustrating steps in a further example of the method of manufacturing a supporting base on which a wiring layer of the present invention has been formed.

As shown in FIG. 6(a), a substrate 33 was bonded to the back surface of a supporting base 36 made of aluminum using an adhesive 34 containing a foaming agent.

Then, in order to carry out pattern formation on the surface of the aluminum of the supporting base 36 using an insulating material, a photosensitive resin layer as the insulating material was formed to have a thickness of about 10 μm. The photosensitive resin layer can be formed by spinner, roll coat, or the like. The photosensitive resin layer was exposed and developed using a mask with a desired pattern, thus forming a photosensitive resin pattern 38 on the surface of the supporting base 36 (FIG. 6(b)).

As a next step, the exposed surface of the supporting base 36 was copper-plated to form a wiring layer 37 made of copper having a desired pattern (FIG. 6(c)).

In this case, when the plating is carried out by non-electroplating, copper also grows on the photosensitive resin pattern 38. Then, in removing the photosensitive resin, the copper that has grown on the photosensitive resin pattern 38 can be removed together with the photosensitive resin (so called "lift-off"). However, when the photosensitive resin is not sufficiently thicker than the copper to be plated, the photosensitive resin is covered by the copper. Therefore, the photosensitive resin cannot be removed well, which may lead to failure in obtaining a wiring layer with a desired pattern.

However, in the case of electroplating, copper does not adhere onto the area of the photosensitive resin pattern 38 of an electrical insulating material. Therefore, the electroplating enables copper easily to adhere selectively onto only the area where the surface of the supporting base 36 is exposed. The etching-stopper layer explained in Production Method 1 may be laminated between the supporting base 36 and the photosensitive resin pattern 38. However, in this case, the etching-stopper layer must be made of a conductive material.

After that, the photosensitive resin pattern 38 was removed using a sodium hydroxide solution of about 3 wt % (FIG. 6(d)).

Then, the temperature was increased to a predetermined temperature by heating to allow the foaming agent contained in the adhesive 34 to foam, thus peeling off the substrate 33. As a result, the supporting base 36 on which the wiring layer 37 formed of copper had been formed in a desired pattern was obtained (FIG. 6(e)).

The adhesion of the copper by plating in the present production method enables the pattern formation precisely according to a resist pattern, since side etching is not caused as in etching. Thus, the present production method is advantageous in forming a minute pattern.

In the above, the layered body in the state shown in FIG. 6(d) may be laminated on an electrical insulating substrate without peeling and removing the substrate 33 by heating and then may be heated and pressurized to peel off the substrate 33 as in Production Method 1.

Fourth Example

Figure 7:
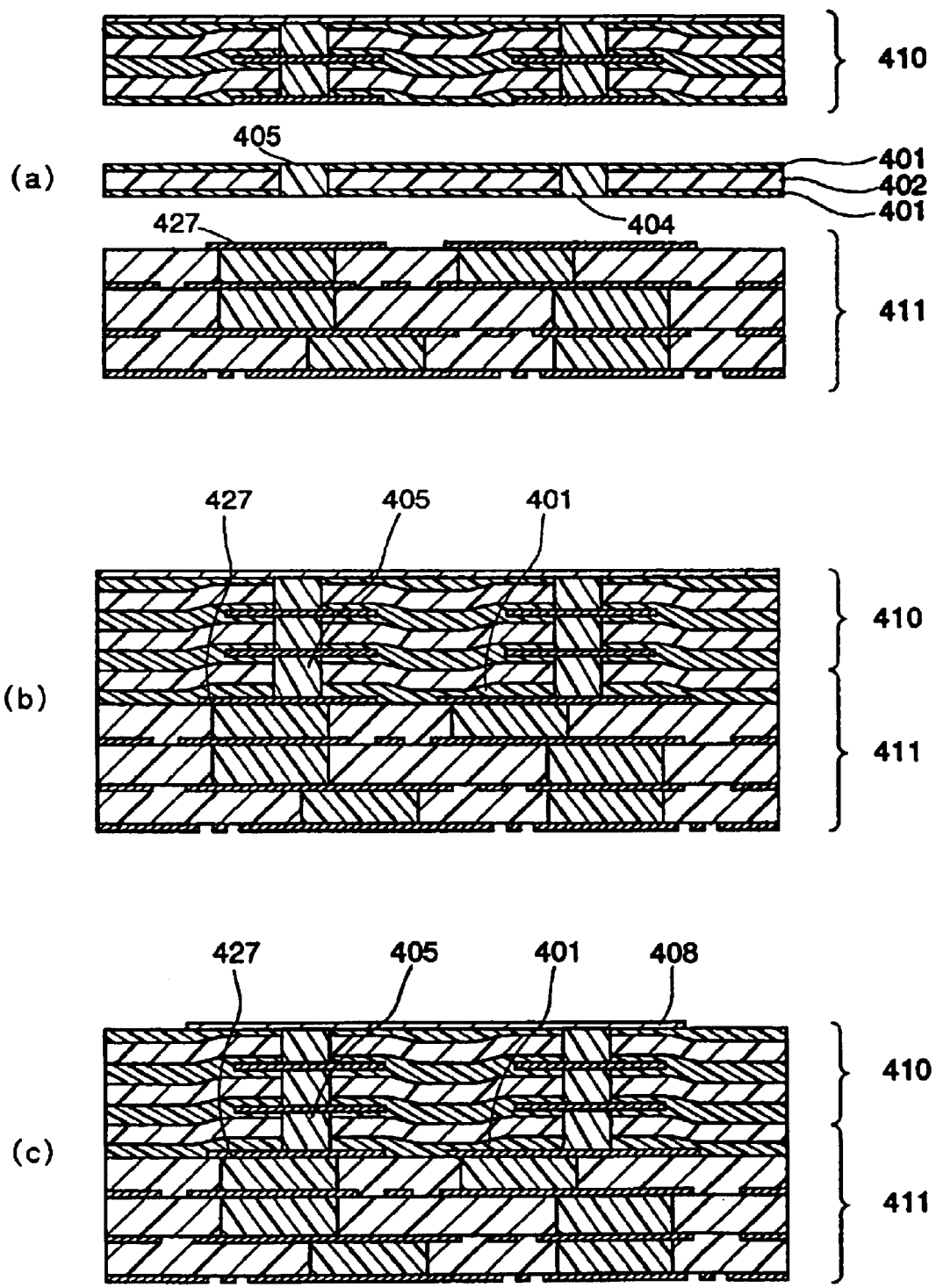
FIGS. 7(a)–(c) show cross-sectional views illustrating steps in a method of manufacturing a multilayer circuit board in a fourth example of the present invention.
Figure 8:
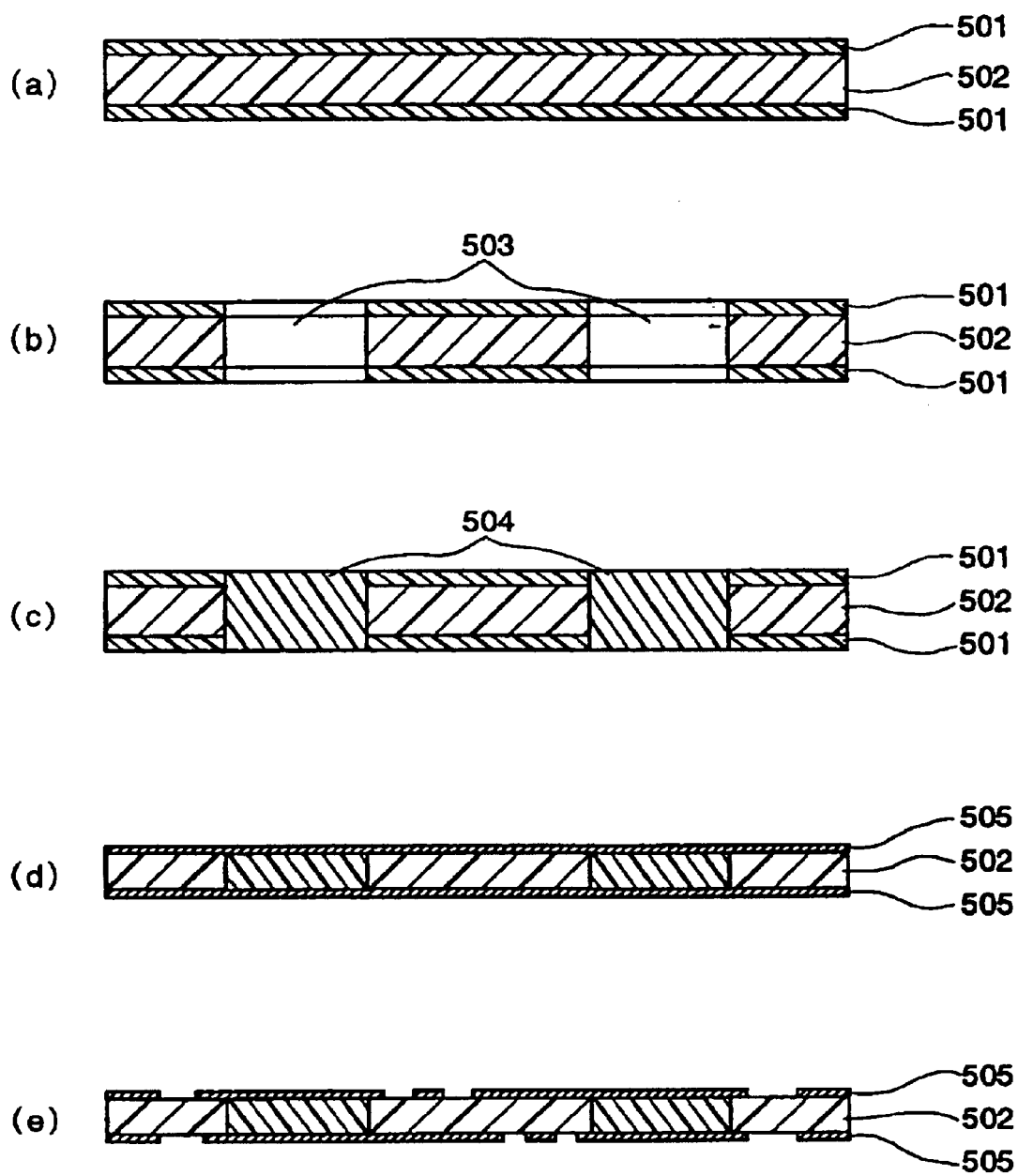
FIGS. 8(a)–(e) show cross-sectional views illustrating steps in a method of manufacturing a conventional multilayer circuit board (an ALIIVH substrate).

A method of manufacturing a multilayer circuit board according to a fourth example of the present invention will be explained with reference to FIG. 7.

As a first step, a multilayer circuit board 410 produced as in the third example and a core substrate 411 having a predetermined number of insulating layers and wiring layers were prepared. The present example will be explained by an example using the multilayer circuit board explained in the conventional example as the core substrate 411. As shown in FIG. 7(a), the multilayer circuit board 410 and the core substrate 411 were superposed with an electrical insulating substrate 402 being sandwiched therebetween. The substrate 402 has adhesive layers 401 on its both surfaces and through holes 404 filled with a conductive paste 405 at predetermined positions. The substrate 402 was obtained by carrying out the same steps as those shown in FIGS. 1(a)–(e) in the first example. After that, as shown in FIG. 7(b), a conductor 427 on the top layer of the core substrate 411 was embedded in the adhesive layer 401 by heating and pressurization to compress the conductive paste 405 within the through holes 404. Thus, the multilayer circuit board 410 and the core substrate 411 were electrically connected to each other. As the last step, as shown in FIG. 7(c), a copper foil 408 of the top layer of the multilayer circuit board 410 was etched selectively in a predetermined shape, thus completing a multilayer circuit board with a minute wiring pattern on its top layer.

The above-mentioned multilayer circuit board is excellent in the wiring formation at a high density. The wiring density was further increased by providing the minute wiring pattern on the top layer. In order to mount semiconductor bare chips, minute wiring corresponding to its pad pitch is required on the top layer. The above-mentioned multilayer circuit board is suitable even for mounting such semiconductor bare chips.

In the present example, the multilayer circuit board 410 was provided on one surface of the above-mentioned multilayer circuit board as the core substrate 411. However, it is advantageous in preventing warp or the like of the whole wiring board to provide the multilayer circuit boards 410 on both the surfaces.

In the multilayer circuit board of the present invention, the aforementioned multilayer circuit board explained in the conventional example was used as the core substrate 411. However, the core substrate 411 is not limited to that. For instance, a glass epoxy multilayer circuit board can be used as the core substrate 411. In this case, compared to a so-called build-up circuit board in which minute wiring is formed on a glass epoxy multilayer circuit board, the following effects are obtained.

(1) A minute wiring layer can be formed on a copper foil in a separate process. Therefore, the degree of freedom in process conditions or the like increases, thus providing high performance.

(2) After the formation of the minute wiring layer on the copper foil, the minute wiring layer is superposed on a core substrate to be transferred, thus enabling rough positioning and therefore improving the yield. In addition, one with a large area can be manufactured.

In a multilayer circuit board formed by transferring a wiring layer to the top layer, a film base with high heat-resistance and high stiffness can be used as described in the first to third examples. Therefore, the multilayer circuit board can withstand a heat treatment in mounting semiconductor bare chips, and the change in size also can be restrained.

When using the method of manufacturing a multilayer circuit board of the present example, the multilayer circuit board 410 of the top layer and the core substrate 411 can be manufactured and tested separately. Therefore, the general yield can be improved. Furthermore, since an electrical insulating substrate with minute through holes is used as a connecting member, positioning accuracy is not strictly limited, which enables easy manufacture.

In the present example, the wiring layer 427 of the top layer of the core substrate 411 was embedded in the adhesive layer 401. However, the multilayer circuit board shown in FIG. 4(e) that was manufactured as in the third example may be laminated with the wiring layer formed of a copper foil 308 that has been selectively etched facing the electrical insulating substrate 402. In this case, the wiring layer of the top layer of the substrate 410 is embedded in the adhesive layer 401. Consequently, the wiring layer formed of the copper foil 308 can compress the conductive paste 405 within the through holes 404, thus obtaining the same effect as the above.

In the above, the supporting base 316 can be removed at the end after embedding the wiring layer 308 of the top layer of the multilayer circuit board 410 in the adhesive layer 401 by heating and pressurization without removing the supporting base 316. In this case, the supporting base 316 protects the minute wiring layer of the top layer until the step just before completing the multilayer circuit board of the present example including the heating and pressurizing step. Therefore, it is advantageous in manufacture.

Moreover, both the wiring layer 427 of the top layer of the core substrate 411 and the wiring layer 308 of the top layer of the multilayer circuit board 410 may be embedded in the adhesive layers 401. In this case, the conductive paste 405 within the through holes 404 is compressed from both sides. As a result, the amount of compressing the conductive paste increases, thus further improving the reliability in connection by the conductive paste.

In the example described above, a core substrate including three laminated insulating layers was used as the core substrate 411, but the core substrate is not always required to include three insulating layers as long as it includes at least one insulating layer. In the example described above, the multilayer circuit board 410 including two laminated electrical insulating substrates was laminated on the core substrate 411 with the electrical insulating substrate 402 being interposed therebetween. However, the present invention is not limited to such a configuration. For example, the multilayer circuit board 410 may include at least three electrical insulating substrates, or a single-layer double-faced circuit board as shown in FIG. 3(d) may be used instead of the multilayer circuit board 410 including a plurality of electrical insulating substrates. Further, a supporting base provided with a wiring layer on its one side as shown in FIG. 1(f) may be used instead of the multilayer circuit board 410 and the supporting base may be removed after lamination.

In the multilayer circuit board obtained in the present example, the inner diameter of the through holes provided in the electrical insulating substrates (the electrical insulating substrate 402 and electrical insulating substrates of the multilayer circuit board 410) is smaller than that of the through holes provided in the insulating layers of the core substrate 411 in the thickness direction. This allows the wirings formed on the electrical insulating substrates to be minuter than the wirings formed on the core substrate (i.e. this allows the wiring width and/or wiring intervals to be reduced).

In addition, at least part of each through hole provided in the top layer of the insulating layers of the core substrate 411 and at least part of each through hole provided in the electrical insulating substrate adjacent to the insulating layer as the top layer may overlap with each other in the lamination direction.

Fifth Example

A multilayer circuit board was manufactured using a substrate bonding body having compressibility, which has through holes filled with a conductive paste and formed at predetermined positions, instead of the electrical insulating substrate 402 having adhesive layers on its both surfaces and the through holes 404 filled with the conductive paste 405 in the fourth example.

As a constituent material of the substrate bonding body, an electrical insulating material, for example, a glass epoxy resin, a phenol resin, a polyimide resin, a polyester resin, an aramide resin, or the like can be used. However, a pre-preg formed by impregnating an aramide nonwoven fabric with epoxy resin and bringing it into a semi-cured state (in a B stage state) can be used in general. By laser processing, through holes are provided in the pre-preg at predetermined positions. The through holes are filled with a conductive paste containing a conductive constituent such as Ag, Cu, an alloy of Ag and Cu, or the like. In this case, when the conductive paste is formed so as to protrude from the surfaces of the substrate bonding body, the conductive paste is compressed favorably. Consequently, the multilayer circuit board 410 and the core substrate 411 can be electrically connected with low resistance. In the present example, a pre-preg with a thickness of about 0.1 mm that was obtained by impregnating a nonwoven fabric formed of aramid fibers with an epoxy resin was processed to have through holes at desired positions using a $CO_2$ laser. Then, the through holes were filled with a Cu paste so that the Cu paste protruded from the surfaces slightly.

As a next step, the multilayer circuit board 410, the aforementioned substrate bonding body, and the core substrate 411 were heated to be compressed at a temperature of 200° C. and a pressure of 45–55 kg/cm² for 60 minutes. As a result, the conductor 427 that protruded from the surface of the core substrate 411 was immersed into the epoxy resin of the substrate bonding body. Simultaneously, the conductive paste was sandwiched by the wiring layer of the multilayer circuit board 410 and the conductor 427 on the surface of the core substrate 411. Therefore, the conductive paste filling the inside the through holes was compressed, thus electrically connecting the wiring layer and the conductor 427.

In the present example, the conductor 427 protruding from the surface of the core substrate 411 was embedded in the substrate bonding body. However, as in the fourth example, a wiring layer protruding from the surface of the multilayer circuit board 410 to be laminated may be preformed, which provides the same effect. Further, both the conductor 427 protruding from the surface of the core substrate 411 and the wiring layer protruding from the surface of the multilayer circuit board 410 may be embedded in the substrate bonding body. In this case, the conductive paste within the through holes is compressed from both sides. As a result, the amount of compressing of the conductive paste increases, thus further improving the reliability in connection by the conductive paste.

Moreover, when the surface of the wiring layer of the multilayer circuit board 410 that comes into contact with the conductive paste and the surface of the conductor 427 on the surface of the core substrate 411 are processed to be rough, the reliability in the connection by the conductive paste improves. In the present example, before the heating and pressurization, a blackening process was carried out on the surface of the wiring layer of the multilayer circuit board 410 and the surface of the conductor 427 of the core substrate 411 using sodium hydroxide 15 g/liter, sodium phosphate 12 g/liter, and sodium chlorite 30 g/liter, thus obtaining rough surfaces with a roughness of about 0.5 $\mu$m. A film produced on the surface of the copper foil by the blackening process is an insulating film. However, the insulating film is extremely thin and therefore is easily broken by heating and pressurization, thus enabling conduction.

Furthermore, as a method of roughening a surface, copper electroplating also can be employed. That is, a method in which copper is abnormally precipitated in a nodule shape by increasing current density to be higher than that of the condition for producing a copper foil has been well known in general. When using this method, a film produced on the surface of the copper foil is made of copper, thus obtaining further stable electric connection.

First Embodiment

In the method of manufacturing a circuit board according to the first example (FIG. 1), when the adhesive layers 101 formed on both surfaces of the electrical insulating substrate 102 have substantially the same volume and the wiring densities of the wiring layers 107 embedded in the respective adhesive layers 101 are different from each other, the respective distances between the electrical insulating substrate 102 and the respective wiring layers 107 may be different on the upper and lower sides in some cases. In other words, when the wiring layers 107 have a high wiring density, the distances between the electrical insulating substrate 102 and the respective wiring layers 107 increase as compared to those when the wiring layers 107 have a lower wiring density.

That is, the differences in wiring pattern and wiring density of the wiring layers 107 cause the difference in degree to which the conductor 105 is compressed by the wiring layers 107. As a result, variations in the connection state between the wiring layers 107 and the conductor 105 occur, resulting in local portions with higher initial connection resistances (via-hole connection resistances before the reliability tests or the like) in the connection. Consequently, variations in the initial connection resistance may occur in some cases.

In addition, depending on the level of variations in the pattern forms and wiring density of the wiring layers 107, the electrical insulating substrate 102 may be deformed due to uneven stresses applied to the electrical insulating substrate 102 via the adhesive layers 101 during the step of heating and pressurizing the wiring layers 107. This deformation may remain inside the circuit board as internal stress depending on the material of the electrical insulating substrate 102 or the like and may be reduced with the passage of time to cause warping or swelling of the circuit board in some cases.

With consideration to the above, a circuit board having less variations in connection resistance and allowing less deformation to be caused in an electrical insulating substrate is described with reference to FIGS. 9 to 12(*b*) as follows.

Figure 9:
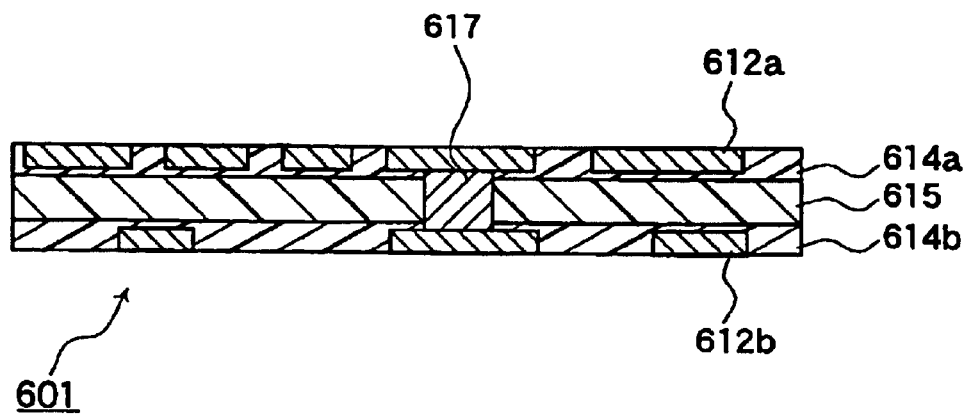
FIG. 9 is a cross-sectional view showing a configuration of a double-faced circuit board according to a first embodiment of the present invention.

As shown in FIG. 9, a double-faced circuit board 601 according to the present embodiment is a so-called double-faced printed circuit board including an electrical insulating substrate 615 and adhesive layers 614*a* and 614*b* on both sides of the electrical insulating substrate 615 with wirings 612*a* and 612*b* being formed in the adhesive layers 614*a* and 614*b*, respectively. The wirings 612*a* and 612*b* are connected electrically to each other through a conductor 617 provided to go through the electrical insulating substrate 615 and the adhesive layers 614*a* and 614*b*. The wirings 612*a* and 612*b* are formed to have substantially uniform thickness.

A process of manufacturing the printed circuit board is described with reference to FIGS. 10(*a*)–10(*c*) and FIGS. 11(*a*)–11(*c*).

Figure 10:
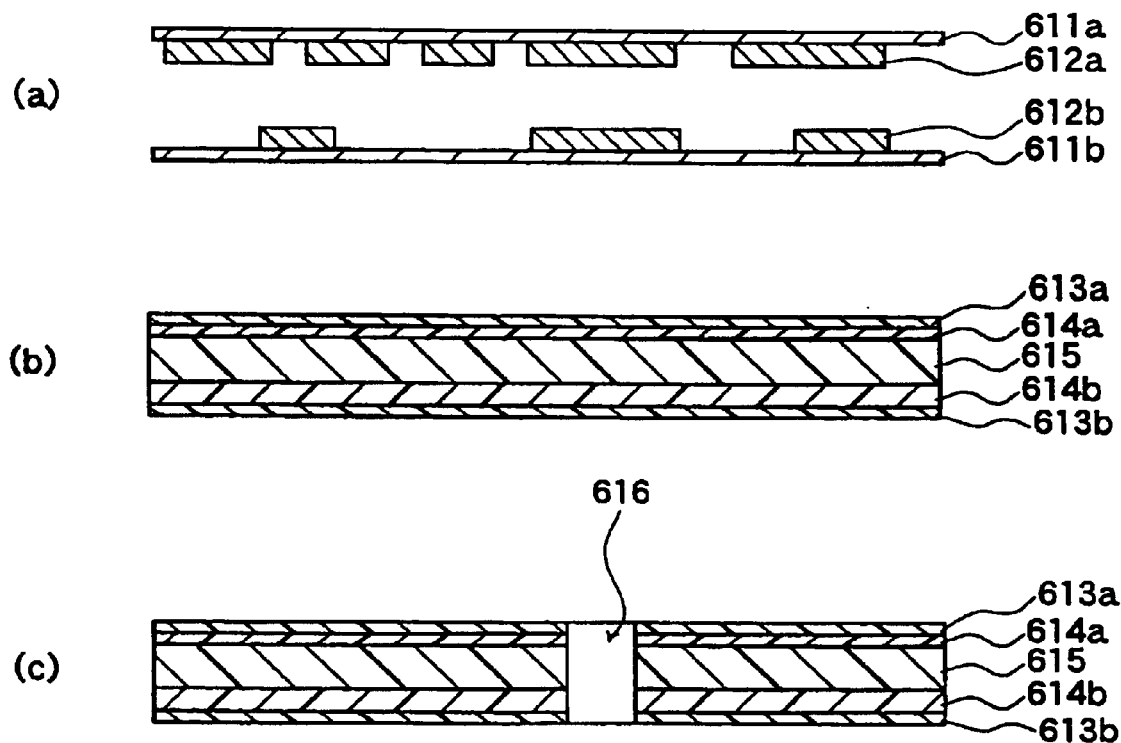
FIGS. 10(a)–(c) show cross-sectional views of configurations of the double-faced circuit board according to the first embodiment in respective main steps during a manufacturing process.
Figure 11:
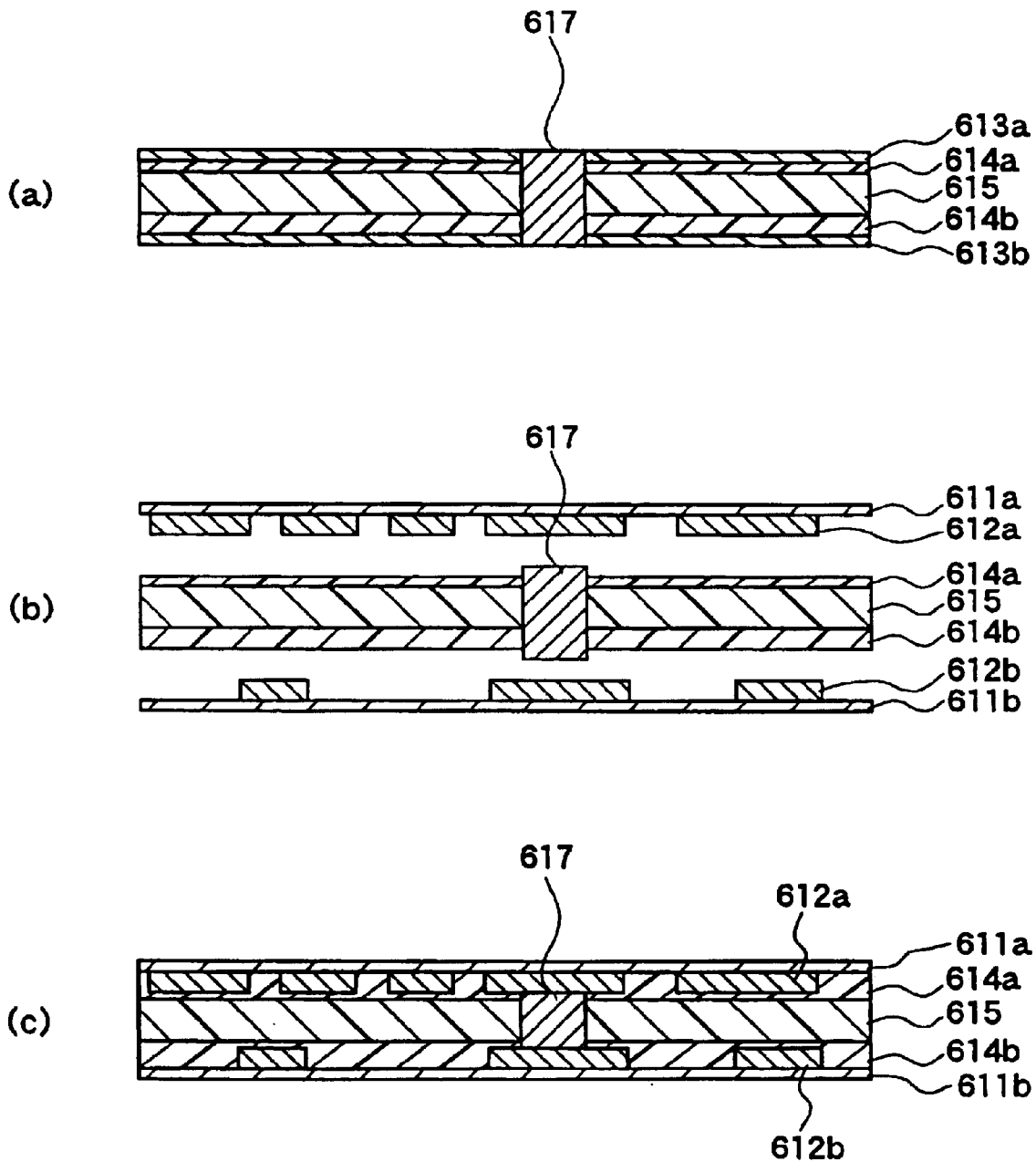
FIGS. 11(a)–(c) show cross-sectional views of configurations of the double-faced circuit board according to the first embodiment in respective main steps subsequent to the step illustrated in FIG. 10(c) during a manufacturing process.

Initially, as shown in FIG. 10(*a*), the wirings 612*a* and 612*b* are formed in desired patterns on two supporting bases 611*a* and 611*b*, respectively. Metal plates or organic resin films may be used as the supporting bases 611*a* and 611*b*.

A simple method for forming the wirings 612*a* and 612*b* includes applying materials of the wirings 612*a* and 612*b* over the whole surfaces of the supporting bases 611*a* and 611*b* and forming patterns of the wirings 612*a* and 612*b* by pattern etching. This method can be applied to both cases of using the metal plates and organic resin films as the materials of the supporting bases 611*a* and 611*b*. A vacuum process such as vacuum evaporation, sputtering, or the like can be used for applying the wiring materials over the whole surfaces of the supporting bases 611*a* and 611*b*. However, when the supporting bases 611*a* and 611*b* are metal plates, it is advantageous to use electroplating in view of the productivity. Pattern plating also can be used as the method of forming the wirings 612*a* and 612*b* on the supporting bases 611*a* and 611*b*.

Next, as shown in FIG. 10(*b*), the adhesive layers 614*a* and 614*b* are formed on both surfaces of the electrical insulating substrate 615 and then release (protective) films 613*a* and 613*b* are formed thereon, respectively. The adhesive layers 614*a* and 614*b* are formed with their thicknesses or volumes being controlled. In other words, with respect to the respective sides of the printed circuit board 601 to be manufactured, the volume except a wiring volume is estimated beforehand, which is described in detail later, and the thicknesses of the adhesive layers 614*a* and 614*b* are controlled so that the volume of the adhesive layer formed on the side of a smaller volume except a wiring volume is smaller than that of the adhesive layer formed on the side of a larger volume except a wiring volume.

The above-mentioned volume except a wiring volume is described in detail with reference to FIGS. 12(*a*) and 12(*b*). In the following, a method of determining the volume except a wiring volume on the wiring 612*a* side in the printed circuit board 601 is described using a specific example. However, it should be appreciated that the volume except a wiring volume on the wiring 612*b* side also can be determined in the same manner.

At the surface on the wiring 612*a* side in the printed circuit board 601, a sum $A_{TOTAL}$ of areas of portions of the adhesive layer 614a where the wiring 612a is not embedded is calculated. The portions where the wiring is not embedded correspond to, for example, portions A shown in FIG. 12(a).

In this case, when there is a part of the wiring 612a exposed completely on the surface of the adhesive layer without being embedded in the adhesive layer 614a, as illustrated as a partial wiring $612a_1$ in FIG. 12(b), the area $A_1$ of the part also is included in the areas $A_{TOTAL}$ of portions where the wiring is not embedded. On the other hand, as illustrated in FIG. 12(b) as a partial wiring $612a_2$, the area of a portion of the adhesive layer 614a where at least part of the wiring 612a is embedded in the thickness direction is not included in the areas $A_{TOTAL}$ of portions where the wiring is not embedded.

Next, an average value $d_{AVE}$ of thicknesses d of parts of the wiring 612a embedded in the adhesive layer 614a is calculated. This average value $d_{AVE}$ of thicknesses d can be calculated by dividing a volume of the wiring to be embedded in design by the area of the wiring actually embedded. In this case, with respect to a portion where at least part of the wiring 612a is embedded in the adhesive layer 614a in the thickness direction, as illustrated in FIG. 12(b) as the partial wiring $612a_2$, a thickness $d_2$ of the part actually embedded in the adhesive layer 614a is considered in the calculation for obtaining the average value $d_{AVE}$.

Then, the sum $A_{TOTAL}$ of areas of portions where the wiring 612a is not embedded is multiplied by the average value $d_{AVE}$ of the thicknesses of parts of the wiring 612a actually embedded. The resulting product is defined as the volume except a wiring volume on the wiring 612a side.

Similarly, a sum $A_{TOTAL}$ of the areas of portions where the wiring 612b is not embedded is multiplied by an average value $d_{AVE}$ of the thicknesses of the parts of the wiring 612b actually embedded. The resulting product is defined as the volume except a wiring volume on the wiring 612b side.

Figure 12:
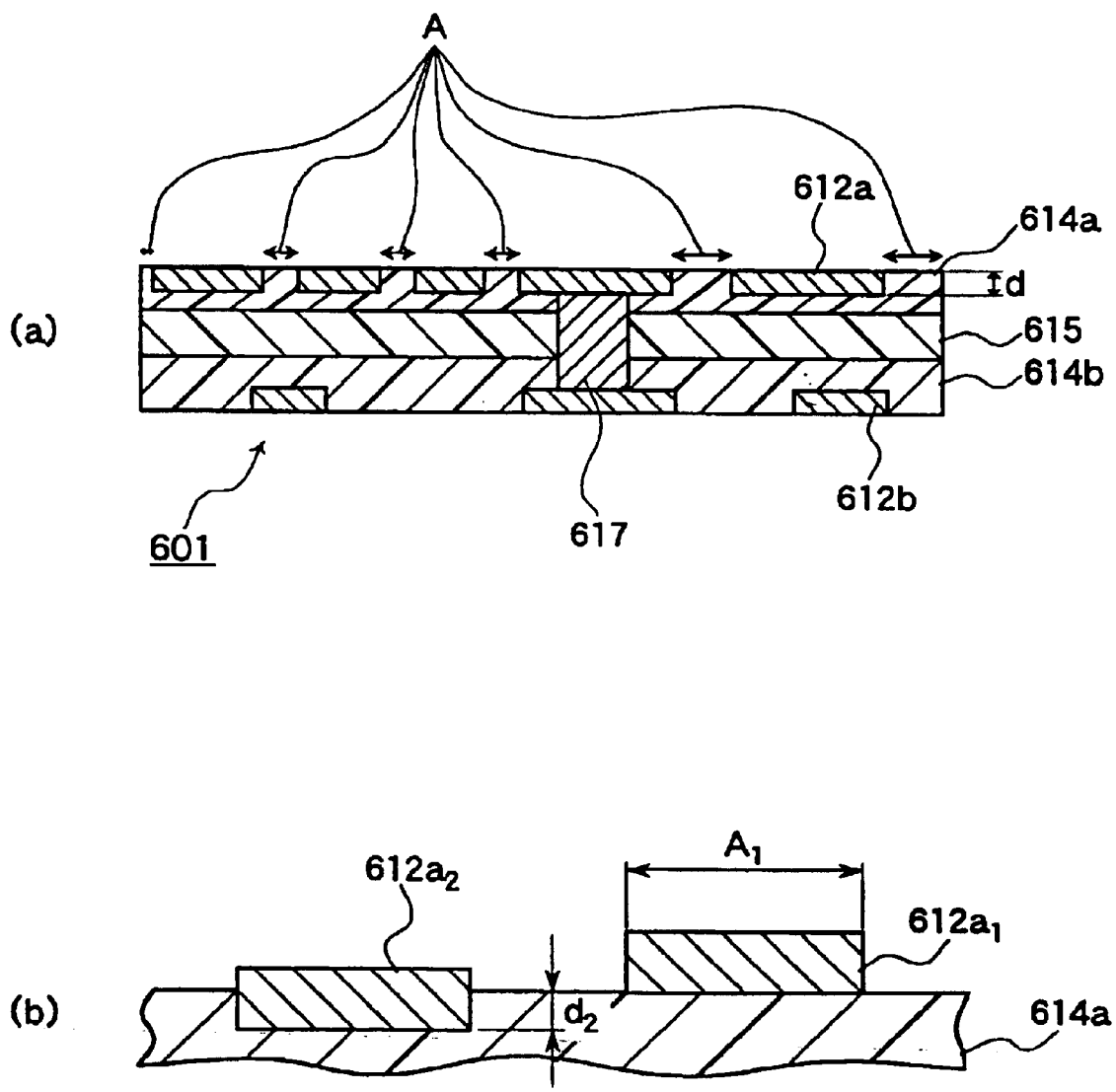
FIGS. 12(a) and (b) are explanatory drawings illustrating a method of obtaining values used for calculation of a volume except a wiring volume.

For instance, in the case where the printed circuit board 601 shown in FIG. 12 is manufactured, when suppose that the volume except a wiring volume on the wiring 612a side is smaller than that on the wiring 612b side, the adhesive layer 614a may be set to be thinner than the adhesive layer 614b as shown in FIG. 10(b) so that the volume of the adhesive layer 614a formed on the wiring 612a side is smaller than that of the adhesive layer 614b formed on the wiring 612b side.

Next, as shown in FIG. 10(c), a through hole 616 is formed, which goes through all the electrical insulating substrate 615, the adhesive layers 614a and 614b, and the release films 613a and 613b. The through hole 616 is formed using a drilling, punching, or laser beam process or the like. However, when the through hole 616 is minute or high productivity is required, the laser beam process is most suitable.

Subsequently, after the through hole 616 is filled with a conductor 617 as shown in FIG. 11(a), the release films 613a and 613b are peeled off. It is preferred to use a conductive paste as the conductor 617, since a resinous constituent contained in the conductive paste is forced out from the through hole when the conductor 617 is compressed and therefore, the density of the conductive constituent contained in the conductor 617 substantially increases to allow the conductor 617 to be dense, thus obtaining a reliable electrical connection between the wirings 612a and 612b. In addition, the conductive paste has an advantage in that the conductive paste is excellent in productivity since the filling of the conductive paste can be carried out by printing. The release films 613a and 613b have a function as a mask in a step of printing the conductive paste. Besides, the release films 613a and 613b provide an effect that the through hole 616 is filled with a sufficient amount of conductive paste after the release films 613a and 613b are peeled off since the volume of the conductive paste filling the through hole 616 increases by the thicknesses of the release films 613a and 613b when compared to the case of using no such release films.

The above description was directed to the example in which the through hole 616 was formed and then was filled with the conductor 617. However, the conductor 617 may be embedded directly into the electrical insulating substrate 615. In this case, a metal wire, a conductive paste cured to some degree, or the like is used as the conductor 617.

After the release films 613a and 613b are peeled off as described above, as shown in FIG. 11(b), the supporting bases 611a and 611b provide with the wirings 612a and 612b are heated and pressurized to adhere to both surfaces of the electrical insulating substrate 615 with the adhesive layers 614a and 614b exposed at the surfaces, respectively.

In this case, since the thicknesses of the adhesive layers 614a and 614b are controlled so that the volume of the adhesive layer 614a on the side of a smaller volume except a wiring volume is smaller than that of the adhesive layer 614b with a larger volume except a wiring volume as described above, the electrical insulating substrate 615 can be prevented from being deformed.

Furthermore, there also is an advantage in that the stability in the connection between the wiring 612a and the conductor 617 can be secured by the control allowing the volume of the adhesive layer 614a to be smaller than that of the adhesive layer 614b.

In other words, the volume of an excess adhesive preventing the wiring 612a from pressurizing the conductor 617 in the heating and pressurizing step is small, and therefore, the conductor 617 is pressurized sufficiently by the wiring 612a even on the side of the smaller volume except a wiring volume. Thus, the initial resistance between the wiring 612a and the conductor 617 can be suppressed to be low and the connection with less variation can be secured.

When not only the relative volumes of the adhesive layers 614a and 614b are controlled depending on the volume except a wiring volume, but also the respective volumes of the adhesive layers 614a and 614b are determined by a function of the volume except a wiring volume, the stable connections between the conductor 617 and the wirings 612a and 612b can be secured irrespective of the wiring patterns.

For example, the respective volumes of the adhesive layers 614a and 614b may be determined depending on the volumes except a wiring volume so that the adhesives interposed between the electrical insulating substrate 615 and the surfaces of the wirings 612a and 612b in contact with the conductor 617 have predetermined thicknesses. In view of obtaining the highly reliable connection, preferably the predetermined thicknesses mentioned above are thin to the degree preventing the wirings 612a and 612b from being separated from the conductor 617 even when, for instance, the adhesive layers 614a and 614b expand thermally or due to humidity.

When a compound of fiber and thermosetting resin is used for the electrical insulating substrate 615, a finished printed circuit board 601 can be provided with high stiffness easily and has an excellent property for mounting of electronic circuit components. Particularly, a compound of glass used as the fiber and epoxy resin used as the thermosetting resin has been used widely in general as a glass epoxy material and also is advantageous in cost. Furthermore, a compound of aramid fiber used as the fiber and epoxy resin as the thermosetting resin is advantageous in excellent processability in the case of using a laser and in easy production.

When using an organic resin film as the electrical insulating substrate 615, the thickness of the printed circuit board 601 can be reduced and the printed circuit board 601 can be provided with flexibility. An aramid film, a polyimide film, a liquid crystal polymer film, or the like is used as the organic resin film. When using the organic resin film, a thin film with a thickness of about 10 microns is available without difficulty and a thin circuit board can be manufactured. When the organic resin film is thin in such a degree, it is possible to connect wirings with an inner via hole with a small diameter. As a result, a high-density circuit board can be obtained.

Furthermore, when thermosetting organic resin is used for the adhesive layers 614a and 614b, the stability in the reliability tests can be improved. Since the thermosetting adhesive layers 614a and 614b are not softened in a high temperature state, the connection state between the electrical insulating substrate 615 and the wirings 612a and 612b does not deteriorate. In addition, the thermosetting adhesive layers 614a and 614b continue to maintain an effect of fixing the wirings 612a and 612b to the conductor 617 in a compressional state when being brought back to a room temperature state, thus obtaining a highly reliable connection.

On the other hand, when the adhesive layers 614a and 614b are made of a thermoplastic material, the adhesives interposed between the electrical insulating substrate 615 and the wirings 612a and 612b are softened in a high temperature state and therefore the contact state between the conductor 617 and the wirings 612a and 612b deteriorates, which is not preferable. In this case, when the adhesive layers 614a and 614b are brought back to a room temperature state from the high temperature state, the adhesion between the wirings 612a and 612b and the adhesive layers 614a and 614b, respectively, is restored, but the adhesive layers 614a and 614b no longer has the effect of fixing the wirings 612a and 612b to the conductor 617 in the compressional state.

The step of forming the wirings 612a and 612b on the supporting bases 611a and 611b as shown in FIG. 10(a) is not always required to be carried out as a first step of the process of manufacturing the printed circuit board 601 and may be carried out concurrently with the steps shown in FIGS. 10(b) to 11(a).

The idea of varying the volumes of the adhesive layers depending on the volumes except a wiring volume described in the present embodiment can be applied to the manufacture of the double-faced circuit board according to the second example and the multilayer circuit boards according to the third to fifth examples.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a circuit board, comprising:
   forming adhesive layers on both surfaces of an electrical insulating substrate;
   forming a conductor going through the electrical insulating substrate and the adhesive layers;
   attaching supporting bases with wirings formed thereon to the electrical insulating substrate by pressure so that at least part of the wirings is embedded in the adhesive layers; and
   removing the supporting bases while leaving the wirings,
   wherein in the process of forming adhesive layers, a volume of one of the adhesive layers exclusive of a volume of the wiring therein is smaller than a volume of other of the adhesive layers exclusive of a volume of the wiring therein.

2. The method of manufacturing a circuit board according to claim 1, wherein the process of forming a conductor comprises:
   forming a through hole going through the electrical insulating substrate and the adhesive layer; and
   filling the through hole with a conductive paste.

* * * * *